United States Patent
Nakaya et al.

(10) Patent No.: US 10,504,741 B2
(45) Date of Patent: Dec. 10, 2019

(54) SEMICONDUCTOR MANUFACTURING METHOD AND PLASMA PROCESSING APPARATUS

(71) Applicant: Tokyo Electron Limited, Tokyo (JP)

(72) Inventors: Michiko Nakaya, Miyagi (JP); Masanobu Honda, Miyagi (JP); Toru Hisamatsu, Miyagi (JP); Masahiro Tabata, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/903,466

(22) Filed: Feb. 23, 2018

(65) Prior Publication Data

US 2018/0247827 A1    Aug. 30, 2018

(30) Foreign Application Priority Data

Feb. 28, 2017  (JP) ................. 2017-036891
Oct. 18, 2017  (JP) ................. 2017-201978

(51) Int. Cl.
*H01L 21/311* (2006.01)
*H01L 21/3213* (2006.01)
(Continued)

(52) U.S. Cl.
CPC .. *H01L 21/31116* (2013.01); *H01L 21/02063* (2013.01); *H01L 21/32138* (2013.01); *H01L 21/76814* (2013.01); *H01L 21/02076* (2013.01)

(58) Field of Classification Search
CPC ......... H01L 21/31116; H01L 21/32138; H01L 21/31138; H01L 21/312; H01L 21/02063;
(Continued)

(56) References Cited

U.S. PATENT DOCUMENTS 5,358,902 A * 10/1994 Verhaar ............. H01L 21/76885
257/E21.508
10,049,921 B2 * 8/2018 Draeger ............. H01L 23/53238
(Continued)

FOREIGN PATENT DOCUMENTS

JP    2015-046449    3/2015
JP    2015-065396    4/2015
(Continued)

*Primary Examiner* — Lan Vinh
(74) *Attorney, Agent, or Firm* — IPUSA, PLLC

(57) ABSTRACT

A semiconductor manufacturing method includes a first process of etching an insulating film over a conductive layer of an object into a pattern of a mask, and exposing the conductive layer to a recessed portion formed in the insulating film, and a second process of forming an organic film in the recessed portion of the insulating film to which the conductive layer is exposed, the second process including, maintaining a chamber at a predetermined pressure, cooling a stage to −20° C. or less, and placing the object on the stage, supplying a gas including a gas containing a low vapor pressure material to the chamber, and generating plasma from the gas including the gas containing the low vapor pressure material, and causing precursors generated from the low vapor pressure material and included in the plasma to be deposited in the recessed portion such that the organic film is formed.

9 Claims, 19 Drawing Sheets

(51) Int. Cl.
*H01L 21/02* (2006.01)
*H01L 21/768* (2006.01)

(58) Field of Classification Search
CPC ........... H01L 21/76814; H01L 21/3065; H01L 21/67248; H01L 21/02076
USPC ....... 438/706, 710, 712, 714, 715, 719, 723, 438/736, 780, 717, 720; 156/345.24, 156/345.26, 345.27
See application file for complete search history.

(56) References Cited

U.S. PATENT DOCUMENTS

| | | | | |
|---|---|---|---|---|
| 2004/0106293 | A1* | 6/2004 | Igarashi | H01L 21/31116 438/690 |
| 2005/0011859 | A1* | 1/2005 | Ji | H01L 21/31116 216/20 |
| 2007/0287296 | A1* | 12/2007 | Chang | H01L 21/465 438/706 |
| 2010/0215460 | A1* | 8/2010 | Watanabe | H01L 21/67207 414/217 |

FOREIGN PATENT DOCUMENTS

| | | |
|---|---|---|
| JP | 2015-149410 | 8/2015 |
| JP | 2016-103595 | 6/2016 |

* cited by examiner

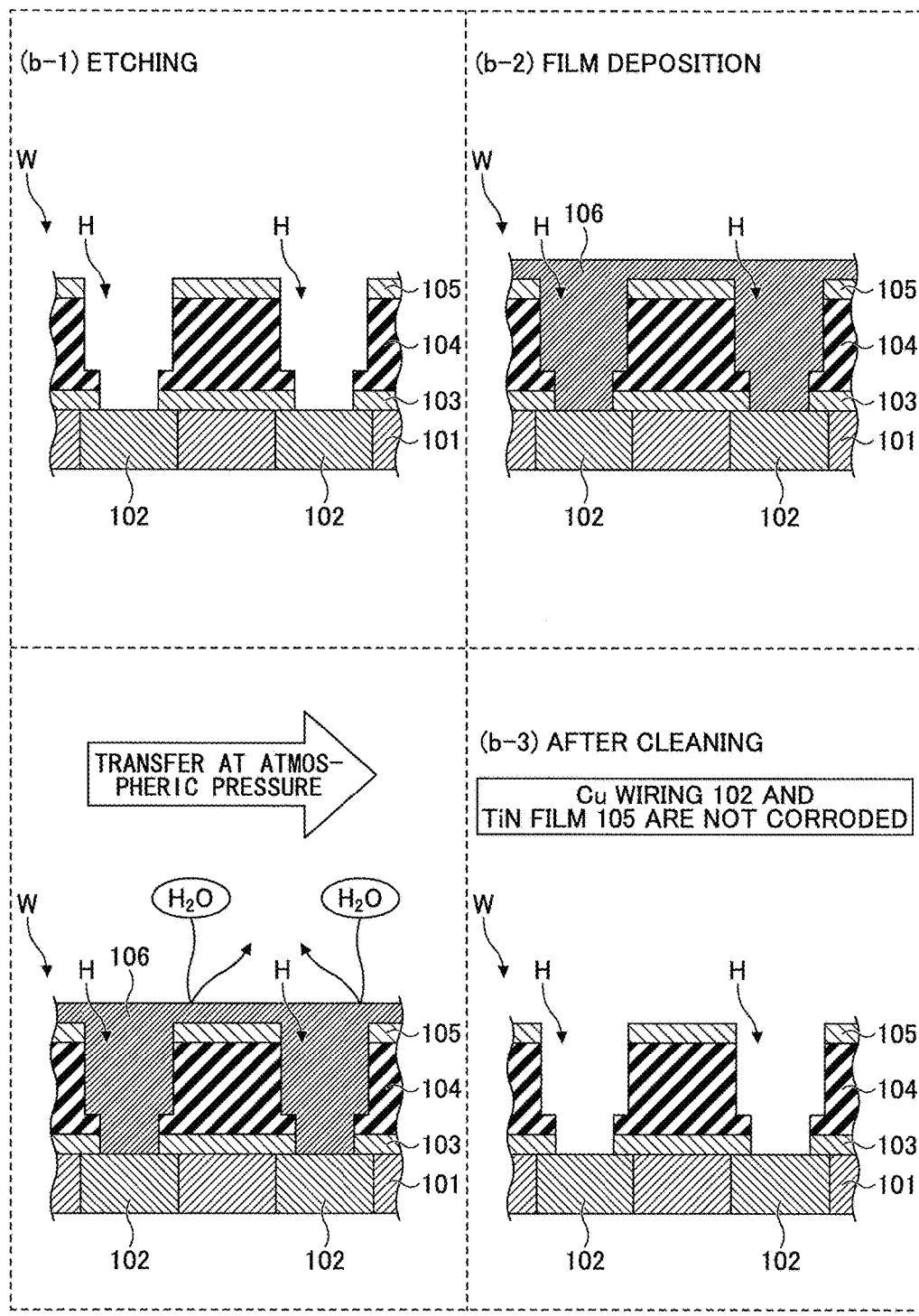

SiN L&S

HIGH A/R

ORGANIC L&S

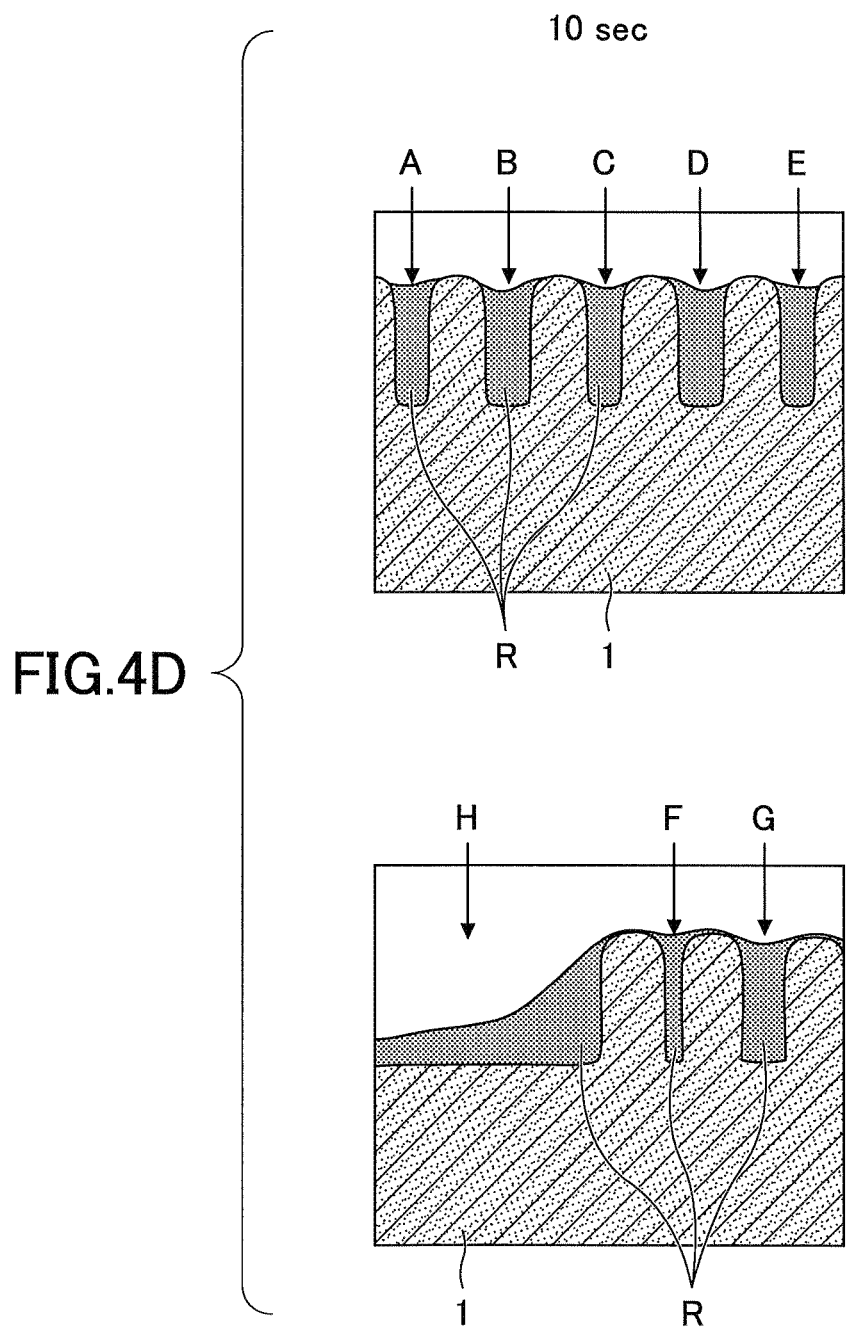

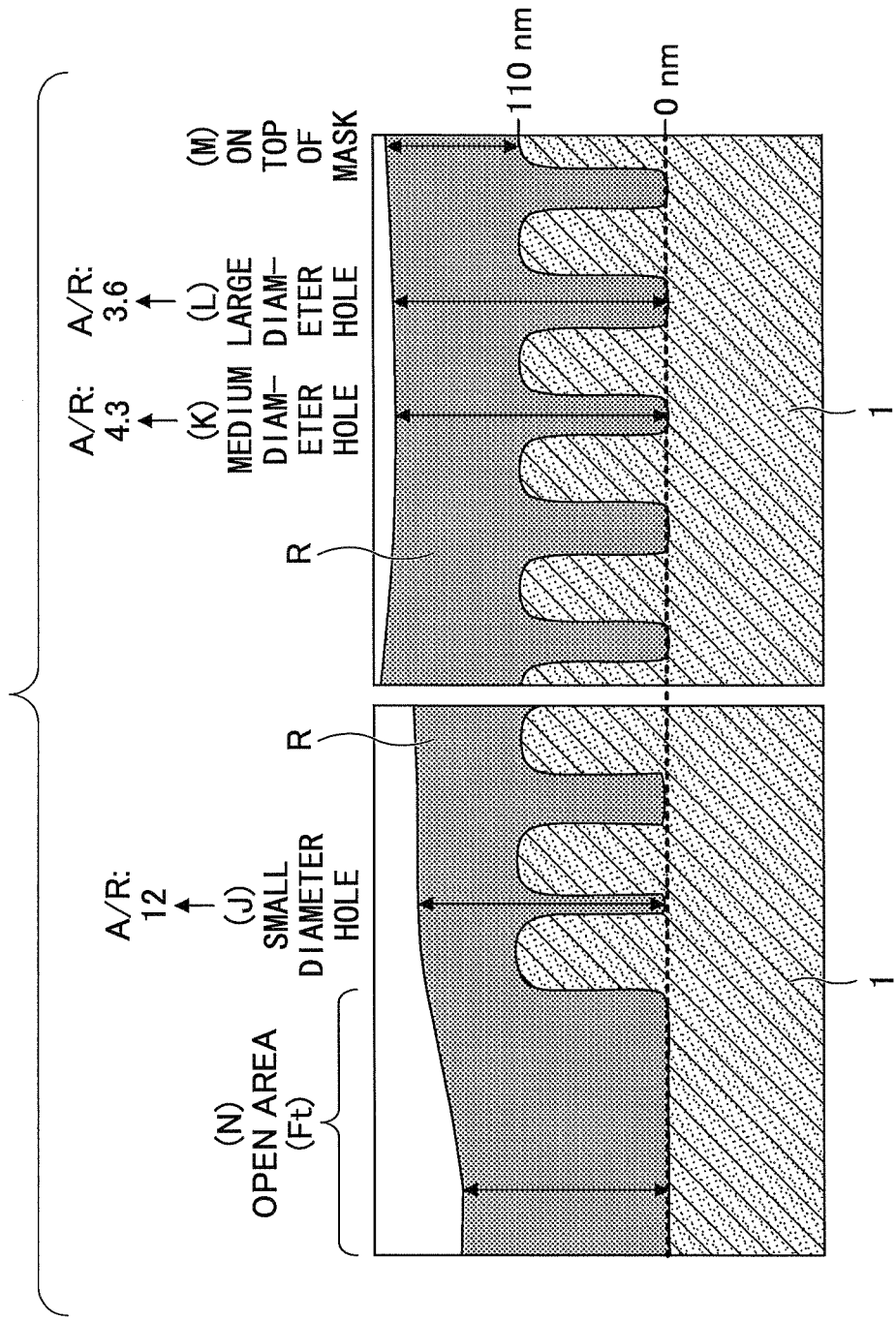

FIG.6

| CONDITION \ TEMPERATURE | -50 °C | -40 °C | -30 °C | -20 °C | -10 °C |
|---|---|---|---|---|---|
| (a) 100 mT $C_4F_6$ 300 sccm | ACCEPTABLE | — | ACCEPTABLE | NOT ACCEPTABLE (VOIDS GENERATED) | NOT ACCEPTABLE (VOIDS GENERATED) |
| (b) 50 mT IPA ($C_3H_8O$) 75 sccm | ACCEPTABLE | ACCEPTABLE | NOT ACCEPTABLE (VOIDS GENERATED) | — | NOT ACCEPTABLE (VOIDS GENERATED) |
| (c) 50 mT $C_4F_6$ 300 sccm | ACCEPTABLE | — | ACCEPTABLE | ACCEPTABLE | NOT ACCEPTABLE (VOIDS GENERATED) |
| (d) 50 mT $C_4F_6$ 125 sccm | — | — | ACCEPTABLE | NOT ACCEPTABLE (VOIDS GENERATED) | NOT ACCEPTABLE (VOIDS GENERATED) |

FIG.7

| STRUCTURAL FORMULA | $C_4F_6$ | IPA($C_3H_8O$) | $C_4F_8$ | $CH_4$ | $CH_3F$ | $CF_4$ |
|---|---|---|---|---|---|---|
| | F F F<br> \|  \|  \|<br>F—C—C=C—F<br> \|<br>F | H H H<br> \|  \|  \|<br>H—C—C—C—H<br> \|  \|  \|<br>H OH H | F F<br> \|  \|<br>F—C—C—F<br> \|  \|<br>F—C—C—F<br> \|  \|<br>F F | H<br> \|<br>H—C—H<br> \|<br>H | H<br> \|<br>H—C—F<br> \|<br>H | F<br> \|<br>F—C—F<br> \|<br>F |
| PROFILE AT −50 °C | R | R | R | V R | V R | 1 |
| WHETHER OR NOT RECESS IS PROPERLY FILLED | ACCEPTABLE | ACCEPTABLE | ACCEPTABLE | NOT ACCEPTABLE (VOIDS GENERATED) | NOT ACCEPTABLE (VOIDS GENERATED) | NOT ACCEPTABLE (NO DEPOSITION) |
| UPPER LIMIT TEMPERATURE FOR FILLING RECESS | −20 °C | −40 °C | −30 °C | — | — | — |

SEMICONDUCTOR MANUFACTURING METHOD AND PLASMA PROCESSING APPARATUS

CROSS-REFERENCE TO RELATED APPLICATION

The present application is based upon and claims priority to Japanese Patent Application No. 2017-036891, filed on Feb. 28, 2017, and the Japanese Patent Application No. 2017-201978, filed on Oct. 18, 2017, the entire contents of which are incorporated herein by reference.

BACKGROUND OF THE INVENTION

1. Field of the Invention

The disclosures herein generally relate to a semiconductor manufacturing method and a plasma processing apparatus.

2. Description of the Related Art

It is known that when a semiconductor wafer is dry-etched, a part of a conductive layer including metal such as Cu wiring formed on the semiconductor wafer is exposed (see Patent Documents 1 through 4, for example). In this state, when the semiconductor wafer is exposed to the atmosphere, the exposed conductive layer reacts with moisture in the atmosphere and changes over time, resulting in corrosion. In order to minimize the corrosion of the conductive layer, a period of time (what is known as a "Q-time") from a dry etching process being ended until a next process being started has been managed.

Meanwhile, in order to prevent the conductive layer from being corroded, coating a conductive layer with a protective film has been proposed. For example, in Patent Document 1, method for coating a metal film such as Cu wiring with a protective film by applying a liquid for immersion exposure during a lithography process has been proposed.

However, in the above-described techniques, when a semiconductor wafer that has been etched is transferred to an exposure apparatus, the semiconductor wafer is exposed to the atmosphere before being coated with a protective film. Therefore, the above-described techniques are insufficient to prevent an exposed metal film from being corroded. Further, the above-described techniques require the exposure apparatus in addition to an etching apparatus, resulting in an increase in costs.

RELATED-ART DOCUMENTS

Patent Documents

[Patent Document 1] Japanese Laid-Open Patent Publication No. 2015-046449
[Patent Document 2] Japanese Laid-Open Patent Publication No. 2015-065396
[Patent Document 3] Japanese Laid-Open Patent Publication No. 2015-149410
[Patent Document 4] Japanese Laid-Open Patent Publication No. 2016-103595

SUMMARY OF THE INVENTION

In view of the above, it is an object of one aspect of the present invention to prevent a conductive layer formed on an object to be processed from being corroded in semiconductor manufacturing.

According to an aspect of at least one embodiment, a semiconductor manufacturing method includes a first process of etching an insulating film over a conductive layer of an object to be processed into a pattern of a mask, and exposing the conductive layer to a recessed portion formed in the insulating film, and a second process of forming an organic film in the recessed portion of the insulating film to which the conductive layer is exposed. The second process includes maintaining an inside of a chamber at a predetermined pressure, cooling a stage to a temperature of −20° C. or less, and placing the object to be processed on the stage, supplying a gas including a gas containing a low vapor pressure material to the inside of the chamber, and generating plasma from the gas including the gas containing the low vapor pressure material, and causing precursors generated from the low vapor pressure material and included in the plasma to be deposited in the recessed portion of the insulating film such that the organic film is formed.

Other objects and further features of the present invention will be apparent from the following detailed description when read in conjunction with the accompanying drawings.

BRIEF DESCRIPTION OF THE DRAWINGS

FIGS. 1A and 1B are drawings illustrating examples of a process according to an embodiment and a process according to a comparative example;

FIGS. 4A through 4E are drawings illustrating examples of experimental results of the film deposition method in semiconductor manufacturing according to the embodiment;

FIGS. 5A and 5B are examples illustrating experimental results showing changes over time in the film formed by the film deposition method in semiconductor manufacturing according to the embodiment;

FIG. 6 is a drawing illustrating an example of experimental results of the film deposition method in semiconductor manufacturing according to the embodiment;

FIG. 7 is a drawing illustrating an example of experimental results of the film deposition method in semiconductor manufacturing according to the embodiment;

DESCRIPTION OF THE PREFERRED EMBODIMENTS

In the following, embodiments of the present invention will be described with reference to the accompanying drawings. In the specification and drawings, elements having substantially the same configurations are referred to by the same numerals and a duplicate description thereof will be omitted.

[Semiconductor Manufacturing Method]

Figure 1A:
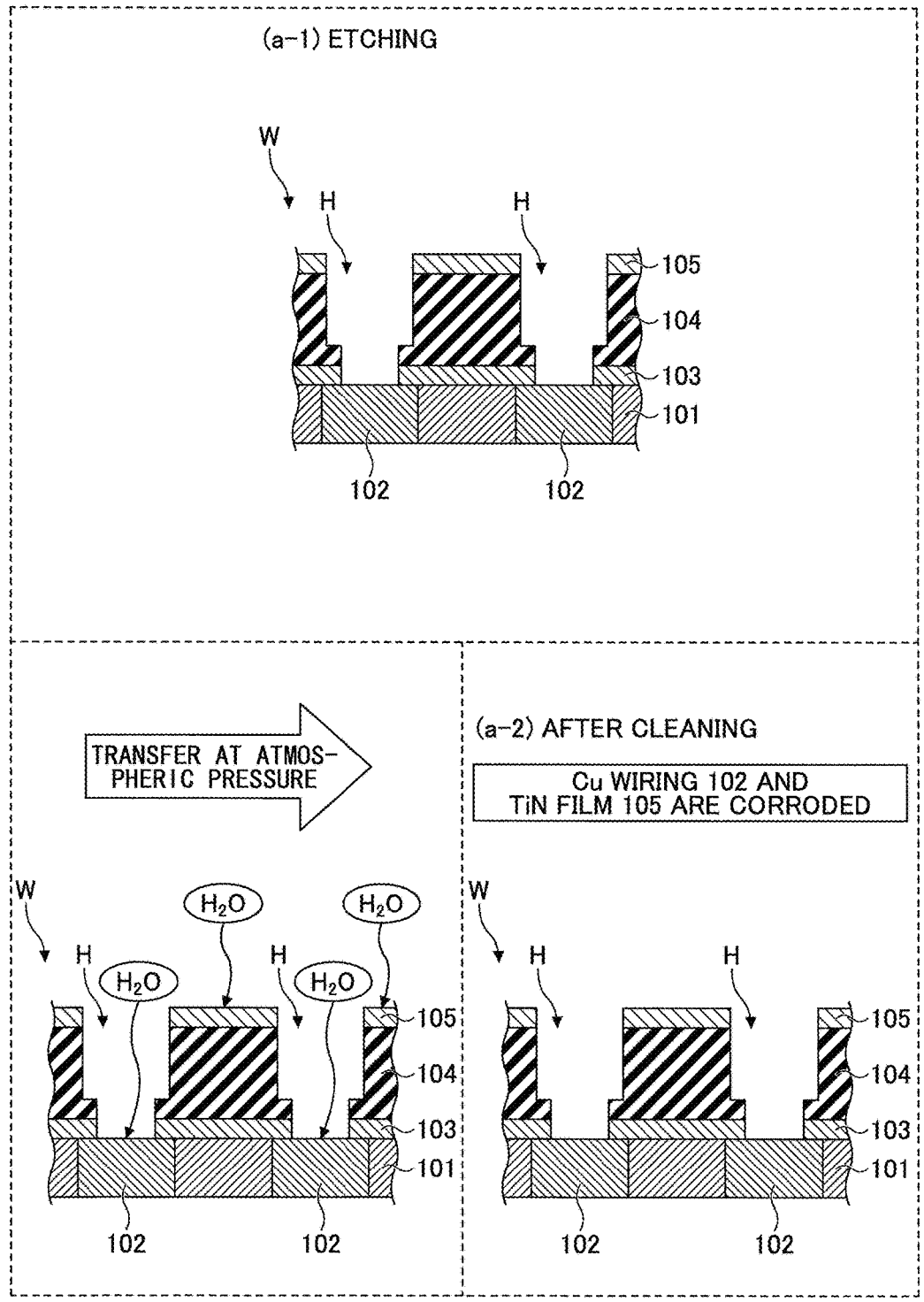

First, an example of a semiconductor manufacturing method according to an embodiment will be described in comparison with a semiconductor manufacturing method of a comparative example. FIG. 1A illustrates an example of the semiconductor manufacturing method of the comparative example. FIG. 1B illustrates an example of the semiconductor manufacturing method of the present embodiment.

In the semiconductor manufacturing method of the present embodiment, a semiconductor wafer (hereinafter referred to as a "wafer W") is etched and at least a part of a conductive layer such as metal wiring is exposed. In this state, a next process can be performed without being restricted by a Q-time. As used herein, the Q-time refers to a limit of time from a previous process such as a dry etching process being ended until a next process being started. For example, the Q-time is managed such that a conductive layer such as metal wiring exposed by the dry etching can be prevented from being oxidized (corroded). Once the Q-time is set, time management for keeping the Q-time is required. The wafer W is an example of an object to be processed.

As illustrated in (a-1) of FIG. 1A and (b-1) of FIG. 1B, the wafer W includes a wiring layer 101, a liner film 103, an interlayer insulating film 104, for example. The wiring layer 101, the liner film 103, and the interlayer insulating film 104 are stacked in this order. Cu wiring 102 is formed in the wiring layer 101. The Cu wiring 102 is an example of a conductive layer such as metal wiring.

The wafer W has via holes H formed by the dry etching. The via holes H include recessed portions formed in the interlayer insulating film 104. The recessed portions are formed by etching the interlayer insulating film 104 into a pattern of a TiN film 105. Further, by etching the liner film 103, the recessed portions extend to the wiring layer 101, and a surface of the Cu wiring 102 is exposed from the bottom of the recessed portions. The interlayer insulating film 104 is an example of an insulating film and may be a $SiO_2$ film, a SiN film, or a SiCN film. The TiN film 105 is an example of a mask formed on an insulating film. The Cu wiring 102 is an example of a metal film.

In the comparative example, after the dry etching process, the wafer W is transferred from an etching apparatus to a cleaning apparatus for a next process, with the Cu wiring 102 being exposed. When the wafer W is transferred, the Cu wiring 102 and the TiN film 105, which are metal portions of layered films of the wafer W, are exposed to the atmosphere and react with moisture in the atmosphere. As a result, by the time the wafer W is loaded into the cleaning apparatus, the surfaces of the Cu wiring 102 and the TiN film 105 are corroded as illustrated in (a-2) of FIG. 1A.

Conversely, in the semiconductor manufacturing method of the present embodiment, after the dry etching illustrated in (b-1) of FIG. 1B is performed, the insides of the recessed portions of the via holes H are filled with a flowable organic film 106 without openings at the top of the recessed portions being blocked. This avoids the exposure of the Cu wiring 102 and the TiN film 105 to the atmosphere while the wafer W is being transferred to the cleaning apparatus for the next process. Accordingly, as illustrated in (b-3) of FIG. 1B, the Cu wiring 102 and the TiN film 105 are not corroded when the wafer W is loaded into the cleaning apparatus. In (b-3) of FIG. 1B, in a state in which the Cu wiring 102 and the TiN film 105 are prevented from being corroded, the flowable organic film 106 filling the recessed portions of the via holes H can be removed by the cleaning apparatus.

[Etching Process/Film Deposition Process/Cleaning Process]

Figure 2:
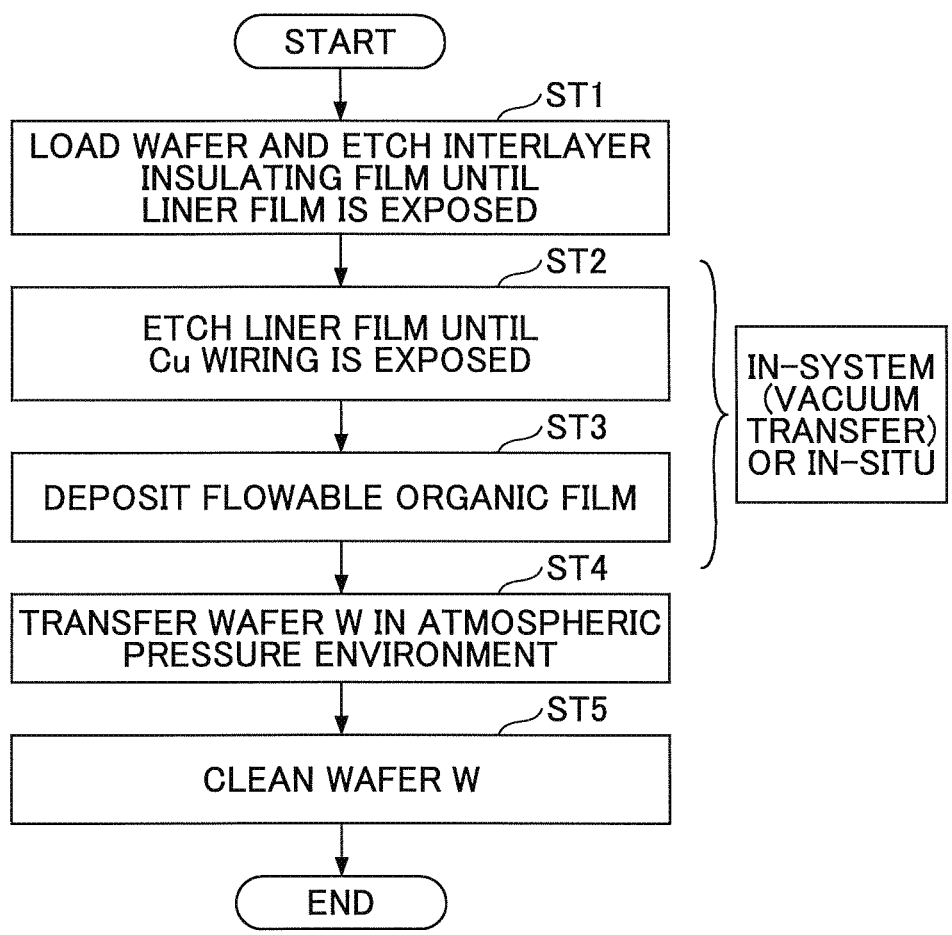
FIG. 2 is a flowchart illustrating an example of a semiconductor manufacturing method according to the embodiment.

Referring to a flowchart of FIG. 2 illustrating an example of the semiconductor manufacturing method according to the present embodiment, the above-described etching process, the film deposition process, and the cleaning process in semiconductor manufacturing according to the present embodiment will be described. First, the wafer W is loaded into the etching apparatus, and the interlayer insulating film 104 is etched until the liner film 103 is exposed (step ST1). Next, in the etching apparatus, the liner film 103 is etched until the Cu wiring 102 is exposed (step ST2). As a result, the via holes H are formed. In the etching in step ST1 and step ST2, a halogen-containing gas such as $CF_4$ gas and $NF_3$ gas may be used. Also, after the etching in step ST2 is performed, the exposed surface of the Cu wiring 102 may be treated with plasma generated from a gas containing $H_2$ and $N_2$ or a gas containing $NF_3$.

Next, in an in-system environment, the wafer W is transferred under vacuum from the etching apparatus to a film deposition apparatus. Alternatively, in an in-situ environment, the flowable organic film 106 is deposited in the same chamber as a chamber in which the etching process of the ST 1 and ST 2 is performed (step ST3).

The term "in-system" as used herein refers to a processing system in which a substrate can be transferred under vacuum from a plasma processing apparatus to another plasma processing apparatus. An example of a configuration of such a processing system (FIG. 12) will be described later. The term "in-situ" as used herein refers to a plasma processing apparatus in which different substrate processing can be performed in the same chamber. An example of a configuration of the plasma processing apparatus (FIG. 13) will be described later. After the film deposition process, the wafer W is transferred to the cleaning apparatus in an atmospheric pressure environment (step ST4). In the cleaning apparatus, the wafer W is cleaned (step ST5).

[Flowable Organic Film/Film Deposition Conditions 1]

Figure 3A:
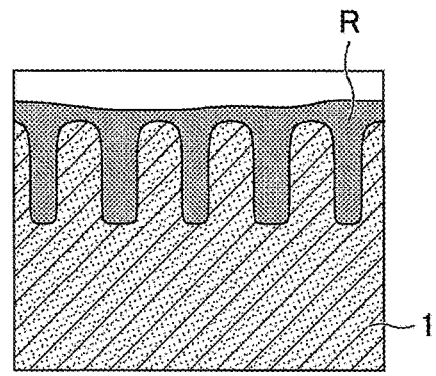
FIGS. 3A through 3C are drawings illustrating examples of experimental results of a film deposition method in semiconductor manufacturing according to the embodiment.
Figure 3B:
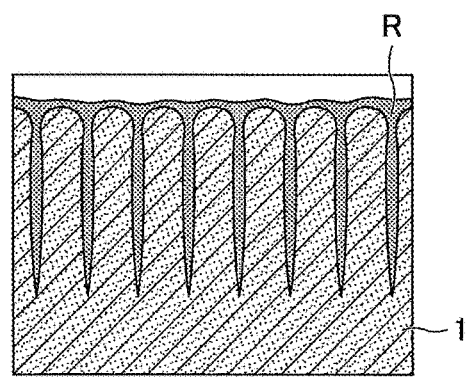
Figure 3C:
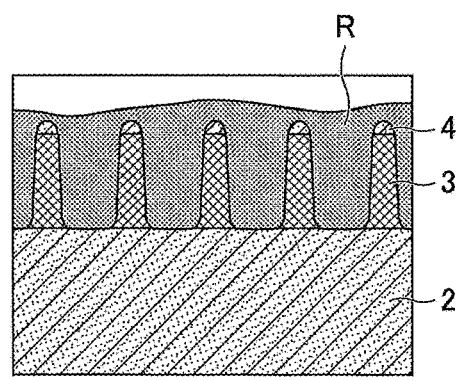
Figure 8:
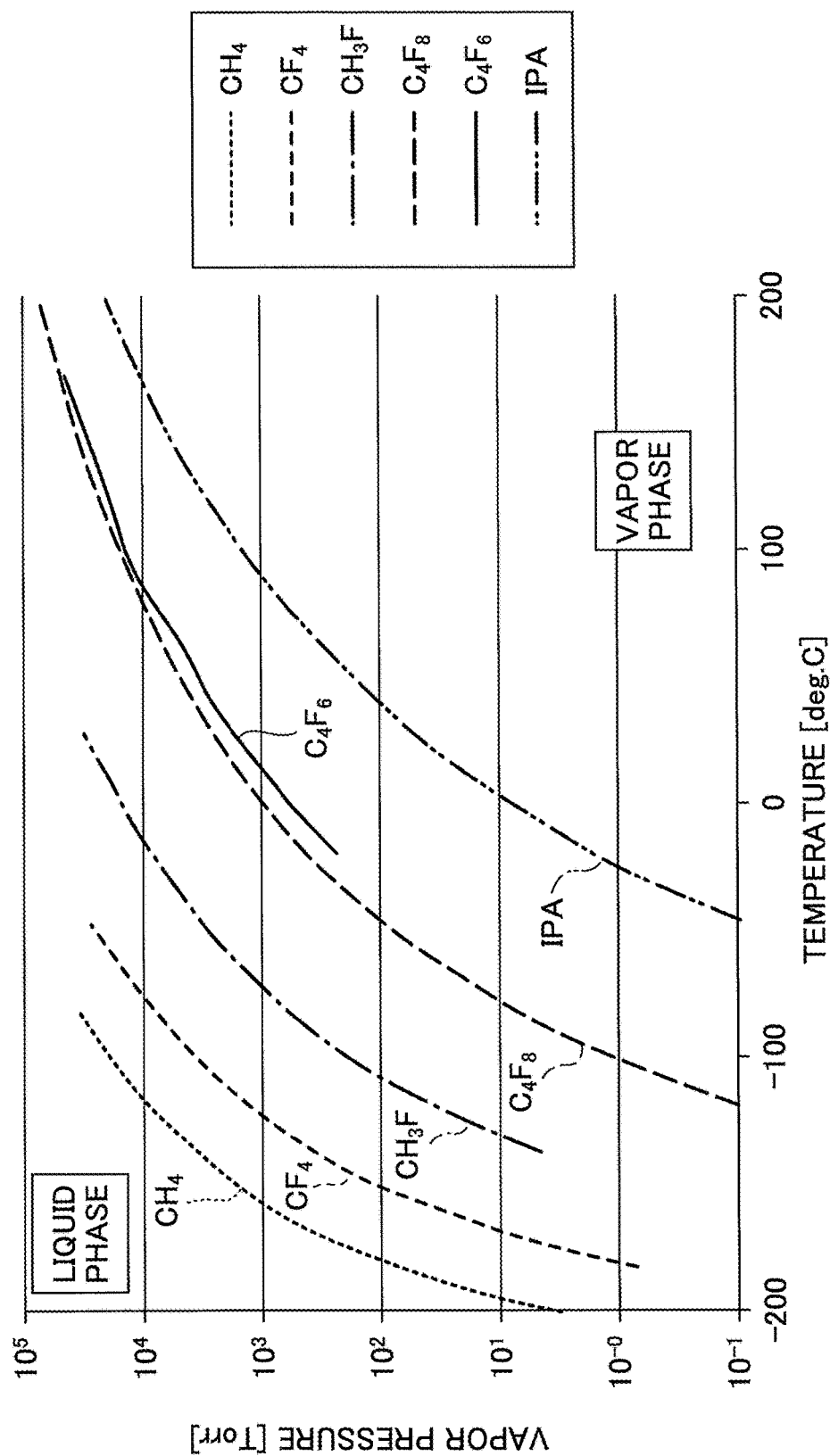
FIG. 8 is a graph illustrating vapor pressure curves.

Next, referring to FIGS. 3 through 8, a flowable organic film deposited in step ST3 will be described. FIGS. 3 through 7 illustrate examples of experimental results of a flowable organic film deposited by the film deposition method in semiconductor manufacturing according to the present embodiment. FIG. 8 illustrates vapor pressure curves of predetermined materials. Film deposition conditions 1 of the flowable organic film in Experiment 1 illustrated in FIGS. 3A through 3C are as follows.

<Film Deposition Conditions 1>
Pressure in chamber: 100 mTorr (13.3 Pa)
Type of gas/gas flow rate: $C_4F_6$, 300 sccm
Stage temperature: −50° C.
Film deposition time: 5 sec
High frequency power HF: 300 W
High frequency power LF: 0 W In the results of Experiment 1, "SiN L&S" in FIG. 3A, "High A/R" in FIG. 3B, and "Organic L&S" in FIG. 3C are exemplary samples of an object processed by the film deposition method. Also, FIGS. 3A through 3C illustrate states of an organic film deposited in the respective samples. In the "SiN L&S" sample, a finely patterned SiN film 1 is formed on the wafer W. Aspect ratios of recessed portions patterned on the SiN film 1 are not uniform. The SiN film 1 has recessed portions having an aspect ratio ranging from 3 to 5 and flat portions illustrated in the lower part of FIG. 4.

In the "High A/R" sample, a SiN film 1 is formed on the wafer W, and recessed portions having an aspect ratio of 18 are formed in the SiN film. In the "Organic L&S" sample, a line-and-space pattern having an aspect ratio of 2 is formed on wafer W. In the "Organic L&S" sample, a base film is a $SiO_2$ film 2. On the $SiO_2$ film 2, an organic film 3 and Si-ARC (anti-reflective coating) 4 are stacked. Recessed portions formed in the "Organic L&S" sample have an aspect ratio of 2. In the semiconductor manufacturing method of the present embodiment, the organic film is deposited in recessed portions of samples having an aspect ratio of 2 or more.

Further, in the experimental results illustrated in FIGS. 3 through 7, the SiN film 1 and the organic film 3 are described as examples of the interlayer insulating film 104 of FIG. 1B. According to the results in FIG. 3, in all the samples "SiN L&S," "High A/R," and "Organic L&S," precursors in plasma generated from $C_4F_6$ gas are deposited in the recessed portions of the samples, and thereby the flowable organic film R is formed. The flowable organic film R is deposited from the bottom of the recessed portions. Therefore, no void is generated. A void refers to a cavity formed in a recessed portion of a via hole H when an opening of the recessed portion is blocked. The experimental results in FIGS. 3 through 7 illustrate states of the flowable organic film R deposited in the present embodiment as an example of the flowable organic film 106.

[Flowable Organic Film/Film Deposition Conditions 2]

Next, using the "SiN L&S" sample, examples showing changes in an flowable organic film R in accordance with the film deposition time will be described with reference to FIGS. 4A through 4E. Film deposition conditions 2 of the flowable organic film in Experiment 2 illustrated in FIGS. 4A through 4E are as follows.

Figure 4A:
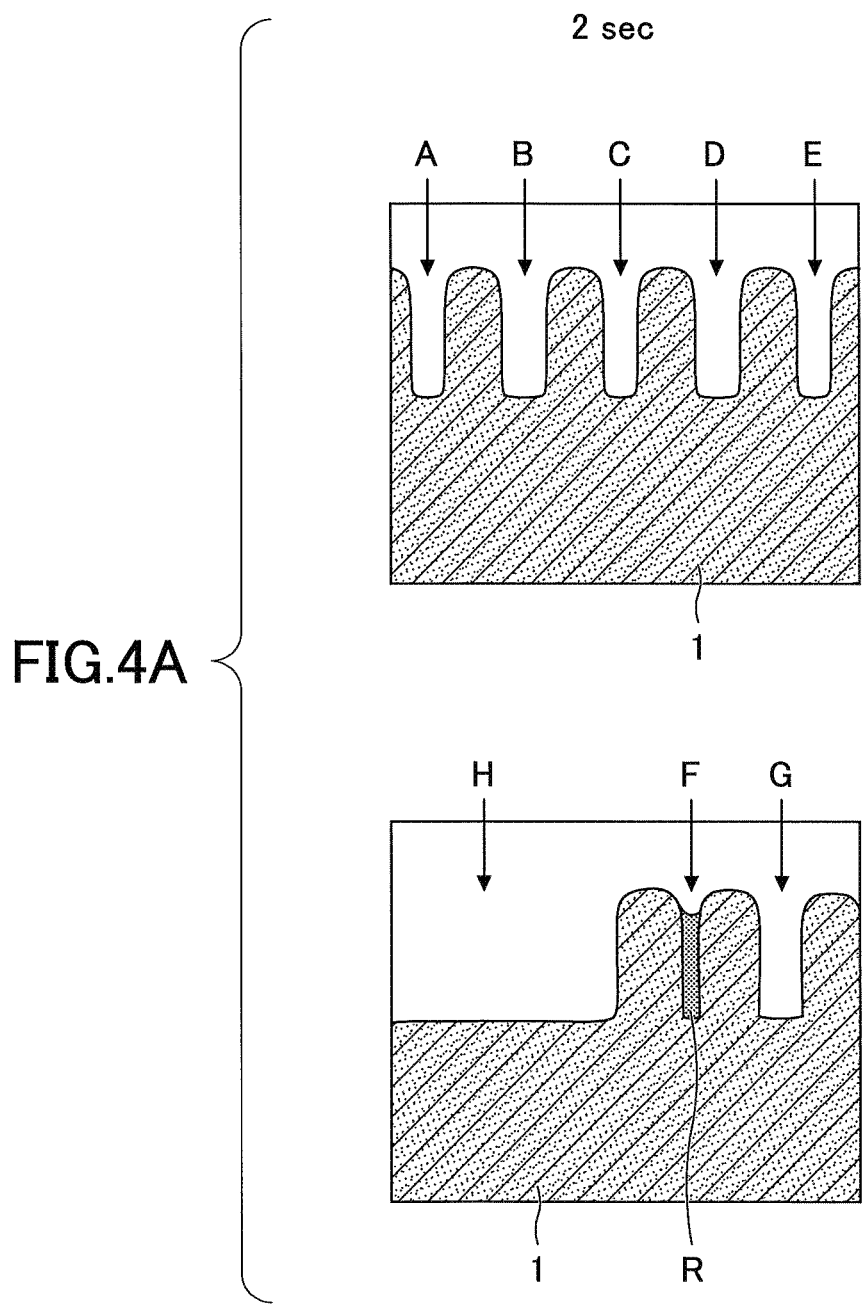

<Film Deposition Conditions 2>
Pressure in chamber: 50 mTorr (6.65 Pa)
Type of gas/gas flow rate: $C_4F_6$, 300 sccm
Stage temperature: −50° C.
High frequency power HF: 300 W
High frequency power LF: 0 W In the results of Experiment 2, FIG. 4A illustrates the flowable organic film R at a film deposition time of 2 seconds. As illustrated in a lower side of FIG. 4A, a recessed portion F having a higher aspect ratio than recessed portions A, C, and E is filled with the flowable organic film R faster than the recessed portions A, C, and E.

Figure 4B:
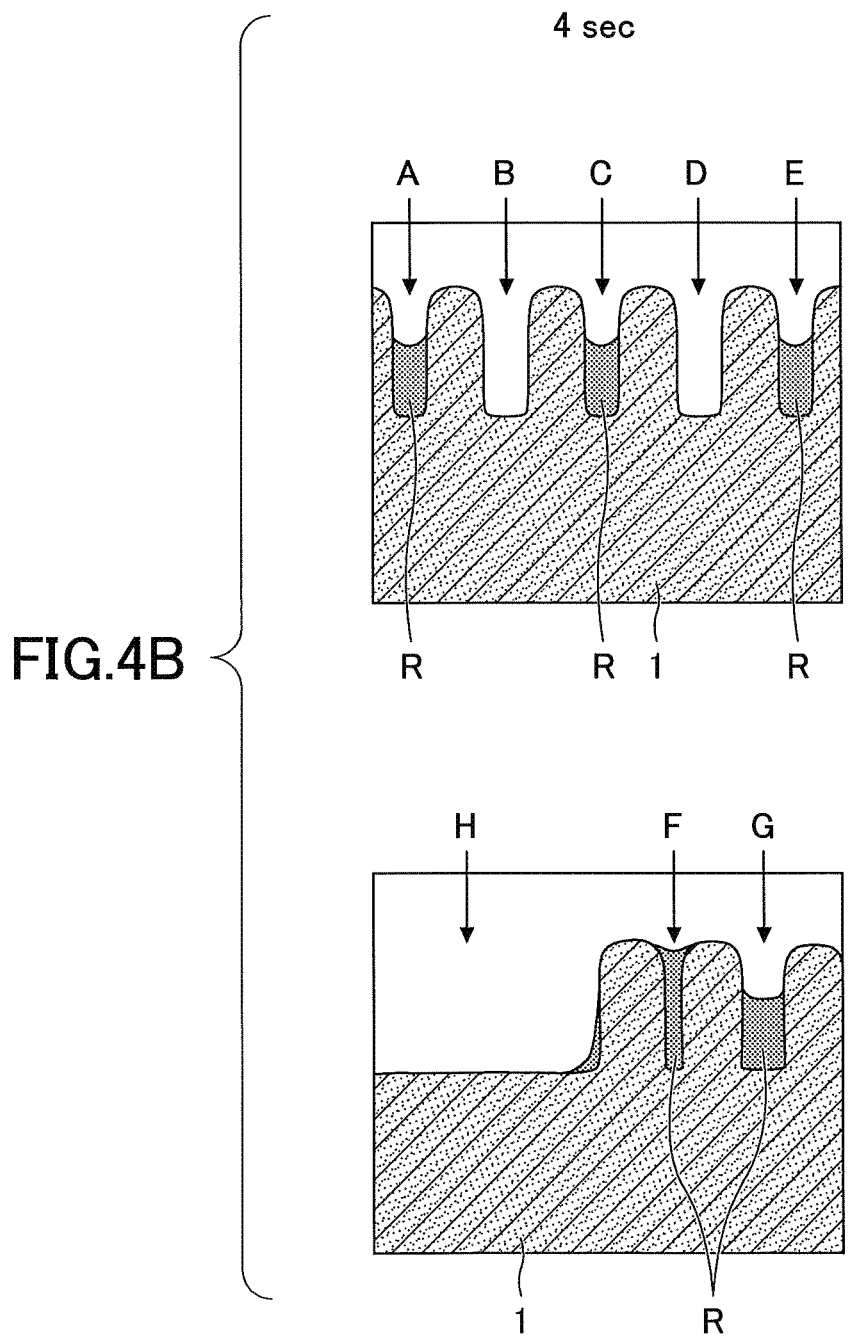

FIG. 4B illustrates the flowable organic film R at a film deposition time of 2 seconds. As illustrated in FIG. 4B, the flowable organic film R is not deposited in recessed portions B and D, and the flowable organic film R is more deposited in the recessed portions A, C, and E than in the recessed portions B and D. Further, the flowable organic film R is deposited in a recessed portion G also. At this point, the flowable organic film R is hardly deposited on a flat portion H.

Figure 4C:
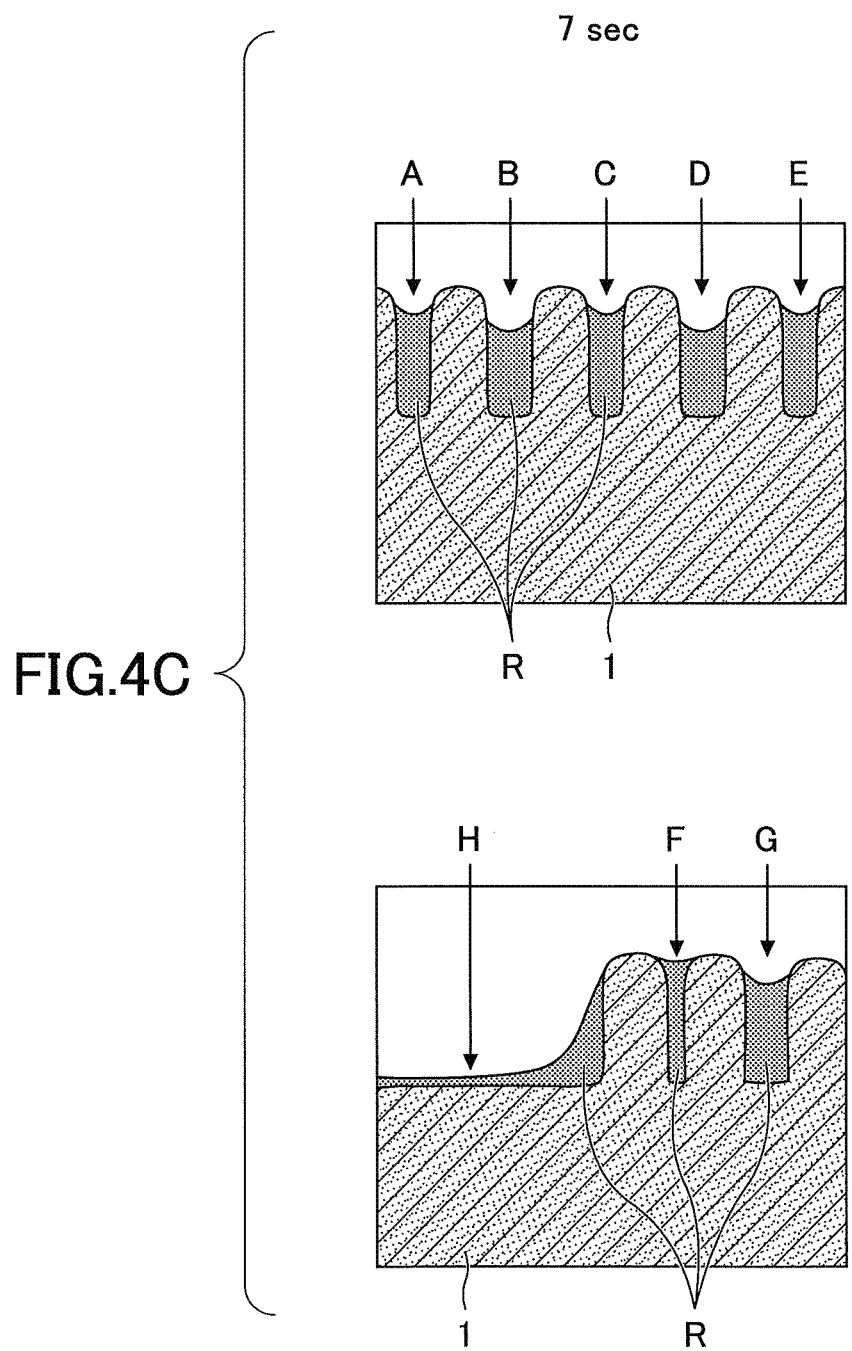
Figure 4E:
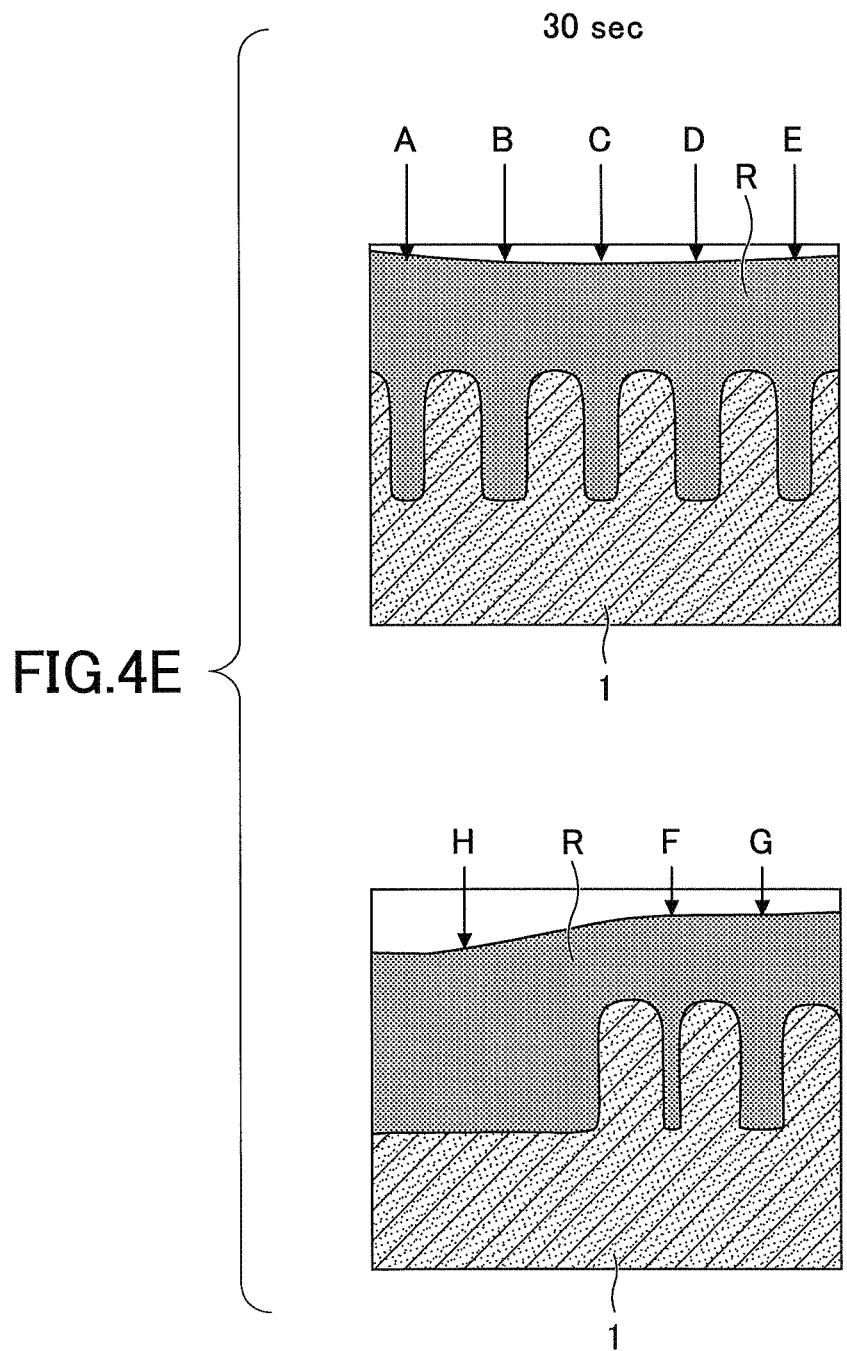

FIG. 4C illustrates the flowable organic film R at a film deposition time of 7 seconds. In FIG. 4C, the flowable organic film R is deposited on the flat portion H also. FIG. 4D illustrates the flowable organic film R at a film deposition time of seconds. In FIG. 4D, the recessed portions A through G are mostly filled with the flowable organic film R. A large amount of the flowable organic film R is deposited in the flat portion H also. FIG. 4E illustrates the flowable organic film R at 30 seconds of film deposition time. In FIG. 4E, all the recessed portions and the flat portion H are filled with the flowable organic film R.

According to the semiconductor manufacturing method of the present embodiment, the flowable organic film R is formed by depositing the precursors in the plasma generated from $C_4F_6$ gas. During this time, the flowable organic film R is grown in a bottom-up approach and deposited from the bottoms of the recessed portions.

Also, it is shown that as an aspect ratio of a recessed portion increases, a film deposition rate becomes higher. Further, it is shown that film deposition rates at the recessed portions A through G of the wafer W are higher than a film deposition rate at the flat portion H.

Figure 5B:
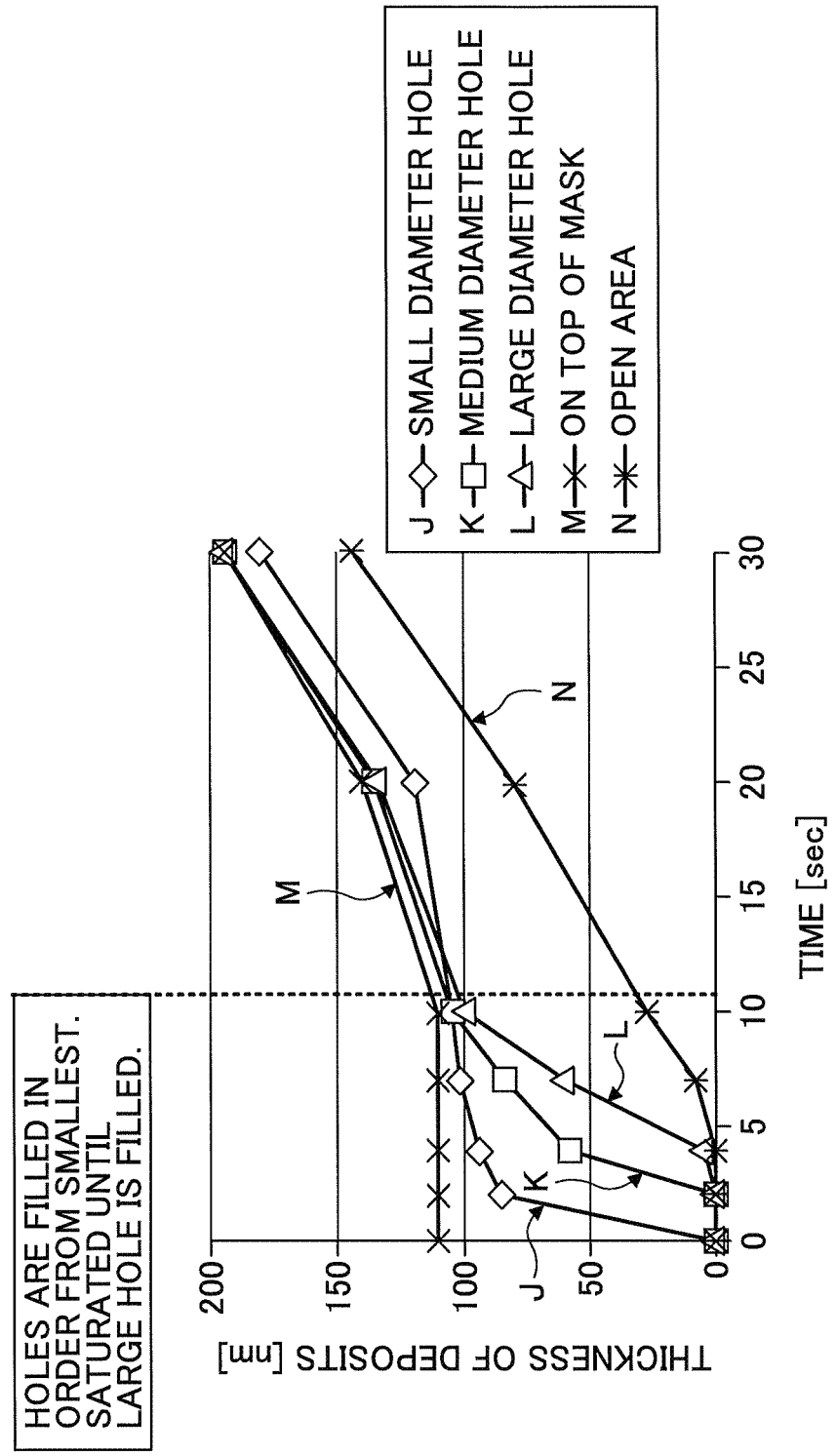

FIG. 5B illustrates the experimental results of FIGS. 4A through 4E in a graph. A horizontal axis of the graph represents a film deposition time (seconds) and a vertical axis represents a thickness (nm) of deposits. A curve J represents changes over time in a thickness of a small diameter hole having an aspect ratio of 12 illustrated in FIG. 5A. A curve K represents changes over time in a thickness of a medium diameter hole having an aspect ratio 4.3. A curve L represents changes over time in a thickness of a large diameter hole having an aspect ratio of 3.6. A curve M represents changes over time in a thickness of deposits on the top (upper portion) of the SiN film 1 serving as a mask. A curve N represents changes over time in a thickness of deposits on a flat portion (an open area).

As illustrated in a cross section of FIG. 5A, when a height at the bottom of the SiN film 1 is taken as 0 nm, a height at the top of the SiN film 1 is 110 nm. Therefore, during a period of time in which the curve M indicates the thickness of 110 nm, no deposits exist on the top of the SiN film 1. Looking at the graph, the curves rise in order from the curve J, the curve K, to the curve L. Namely, the inside of the small diameter hole indicated by the curve J, the inside of the medium diameter hole indicated by the curve K, and the inside of the large diameter hole indicated by the curve L are filled with the flowable organic film R in this order.

Further, as is shown by the thickness of the deposits on the top of the SiN film 1 (on top of the mask) indicated by the curve M, the flowable organic film R is deposited on the top of the SiN film 1 after the small diameter hole, the medium diameter hole, and the large diameter hole are filled. Moreover, the flowable organic film R starts to be deposited on the flat portion indicated by the curve N 10 seconds before the small diameter hole, the medium diameter hole, and the large diameter hole are all filled with the flowable organic film R. However, the film deposition rate at the flat portion is approximately the same as the film deposition rate at the top of the SiN film 1.

[Flowable Organic Film/Film Deposition Conditions 3]

Next, referring to FIG. 6, the temperature dependence and the pressure dependence of the flowable organic film R will be described. In film deposition conditions 3 of the flowable organic film in Experiment 3 illustrated in FIG. 6, the temperature of a stage on which the wafer W is placed is set to a temperature of −20° C. or less and the pressure in a chamber is set to 50 mTorr or more. For example, a condition (a) of FIG. 6 illustrates states of the film at respective temperatures when the pressure in the chamber is maintained at 100 mTorr and $C_4F_6$ gas is supplied at 300 sccm. This indicates that the film is isotoropically deposited at temperatures of −10° C. and −20° C. and an upper end of an opening of the SiN film 1 becomes narrowed and voids V are generated. Namely, according to the semiconductor manufacturing method of the present embodiment, the flowable organic film R is not deposited in a bottom-up approach. Conversely, at temperatures of −30° C. and −50° C., the flowable organic film R is deposited in a bottom-up approach, and thus no void V is generated. A result was not obtained in a case where the temperature is −40° C.

A condition (b) of FIG. 6 illustrates states of the film at respective temperatures when the pressure in the chamber is maintained at 50 mTorr and IPA (isopropyl alcohol: $C_3H_8O$) gas is supplied at 75 sccm. IPA is one of secondary alcohols. At temperatures of −10° C. and −30° C., voids V are generated and the film is isotoropically deposited. At temperatures of −40° C. and −50° C., the flowable organic film R is deposited in a bottom-up approach according to the semiconductor manufacturing method of the present embodiment. A result was not obtained in a case where the temperature is −20° C.

A condition (c) of FIG. 6 illustrates states of the film at respective temperatures when the pressure in the chamber is maintained at 50 mTorr and $C_4F_6$ gas is supplied at 300 sccm. At a temperature of −10° C., voids V are generated and the film is isotoropically deposited. At temperatures of −20° C., −30° C., and −50° C., the flowable organic film R is deposited in a bottom-up approach. A result was not obtained in a case where the temperature is −40° C.

A condition (d) of FIG. 6 illustrates states of the film at respective temperatures when the pressure in the chamber is maintained at 50 mTorr and $C_4F_6$ gas is supplied at 125 sccm. At temperatures of −10° C. and −20° C., voids V are generated and the film is isotoropically deposited. At a temperature of −30° C., the flowable organic film R is deposited in a bottom-up approach. A result was not obtained in a case where the temperature is −40° C. and −50° C., respectively.

Accordingly, a temperature at which recessed portions can be filled with the flowable organic film R differs depending on the type of gas, the pressure, and the gas flow rate. In a case where the pressure in the chamber is maintained at 50 mTorr and $C_4F_6$ gas is supplied at 300 sccm, recessed portions can be filled with the flowable organic film R by maintaining the stage at a temperature of −20° C. or less and applying pressure in the chamber at 50 mTorr or more.

[Flowable Organic Film/Film Deposition Conditions 4]

Next, referring to FIG. 7 and FIG. 8, the gas-type dependency of the flowable organic film R will be described. FIG. 7 illustrates an example of results of the film deposition process of the present embodiment performed using different types of gas. According to the results of the experiment, when $C_4F_6$ gas, IPA ($C_3H_8O$) gas, or $C_4F_8$ gas is used, recessed portions are filled with the flowable organic film R, and no void is generated. Conversely, when $CH_4$ gas, $CH_3F$ gas, or $CF_4$ gas is used, voids V are generated, and thus recessed portions cannot be filled with the flowable organic film R.

FIG. 8 illustrates vapor pressure curves of $C_4F_6$ gas, IPA ($C_3H_8O$) gas, $C_4F_8$ gas, $CH_4$ gas, $CH_3F$ gas, $CF_4$ gas. When the $CH_4$ gas, the $CH_3F$ gas, and the $CF_4$ gas are used, voids are generated in the film.

Vapor pressures of the $CH_4$ gas, the $CH_3F$ gas, and the $CF_4$ gas are at temperatures lower than temperatures indicated by the vapor pressure curve of the $C_4F_8$ gas. Conversely, when $C_4F_8$, $C_4F_6$, and isopropyl alcohol (IPA) are used, the flowable organic film R is deposited in a bottom-up approach without any void generated in the film. Vapor pressures of the $C_4F_8$ gas, the $C_4F_6$ gas, and the isopropyl alcohol (IPA) gas are at temperatures equal to or greater than temperatures indicated by the reference vapor pressure curve of the $C_4F_8$ gas. A gas having a vapor pressure at a temperature equal to or greater than a temperature indicated by the vapor pressure curve of $C_4F_8$ gas is referred to as a gas containing a low vapor pressure material.

In view of the above-described results, the semiconductor manufacturing method of the present embodiment includes a process of placing a wafer W on a stage cooled to a temperature of −20° C. or less with an inside of a chamber 10 being maintained at a predetermined pressure, and also includes a process of supplying a gas including a gas containing a low vapor pressure material.

Further, the semiconductor manufacturing method of the present embodiment includes a process of generating plasma from the supplied gas including the gas containing the low vapor pressure material, and depositing precursors in the plasma generated from the gas including the gas containing the low vapor pressure material onto the wafer W. In this way, a flowable organic film R can be deposited in a bottom-up approach from the bottoms of recessed portions. At this time, a pressure inside the chamber 10 is at least 50 mTorr (6.67 Pa), and is preferably lower than a vapor pressure indicated by the vapor pressure curve of the gas including the gas containing the low vapor pressure material. Further, the gas containing the low vapor pressure material may be a carbon-containing gas. More specifically, the carbon-containing gas may be formed of any one of $C_4F_8$, $C_4F_6$, and isopropyl alcohol (IPA). According to the semiconductor manufacturing method of the present embodiment, precursors generated from the low vapor pressure material can be deposited from the bottom of the recessed portions of the wafer W such that a flowable organic film is formed on the wafer W.

[Film Thickness and Metal Corrosion]

Figure 9:
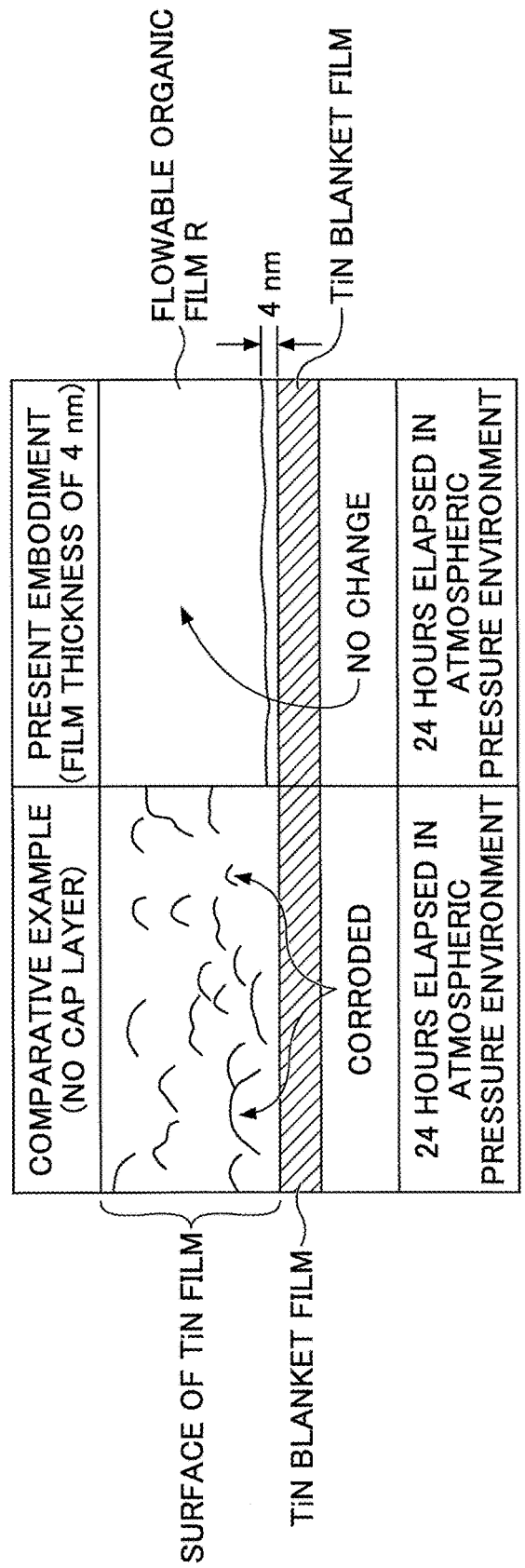
FIG. 9 is a drawing illustrating an example of a thickness and metal corrosion results of a film formed by the film deposition method according to the embodiment.
Figure 10:
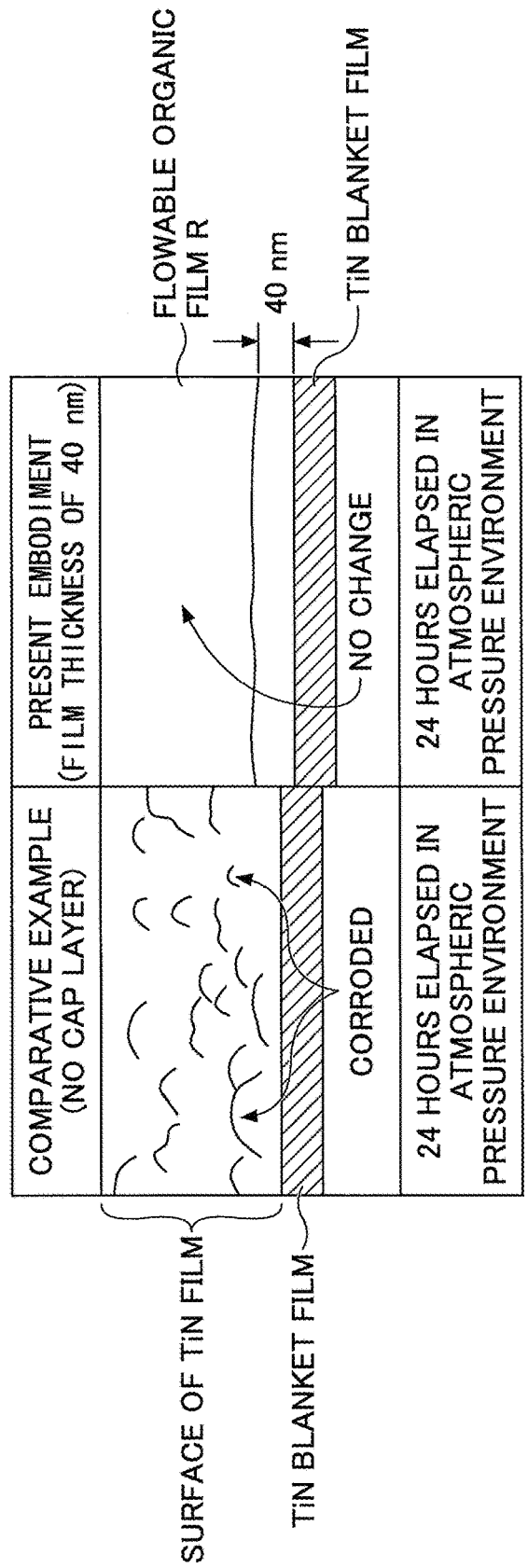
FIG. 10 is a drawing illustrating an example of a thickness and metal corrosion results of a film formed by the film deposition method according to the embodiment.

FIG. 9 and FIG. 10 illustrate examples of preventive effects of metal films by depositing a flowable organic film R as described in step ST3. In the present embodiment illustrated in FIG. 9, a flowable organic film R having a thickness of 4 nm is deposited on a TiN blanket film under the following film deposition conditions such that the TiN film is coated. In a comparative example illustrated in FIG. 9, a TiN blanket film is not coated with a flowable organic film R (no cap layer). FIG. 9 illustrates changes over time in the surfaces of the two TiN films after the TiN films are left in an atmospheric pressure environment for 24 hours.

<Flowable Organic film Deposition Conditions>

Pressure in chamber: 100 mTorr
Type of gas/gas flow rate: $C_4F_6$, 300 sccm
Stage temperature: −50° C.
High frequency power HF: 300 W
High frequency power LF: 0 W According to the results illustrated in FIG. 9, the comparative example indicates that fluorine reacts with moisture in the atmosphere. As a result, the surface of the TiN film was deteriorated, causing the surface to be uneven and corroded. Conversely, the present embodiment illustrated in FIG. 9 indicates that the surface of the TiN film is not deteriorated and no corrosion or unevenness appears.

In FIG. 10, one TiN film is coated with a flowable organic film R having a thickness of 40 nm (the present embodiment) and another TiN film is not coated with the flowable organic film R (a comparative example) under the above-mentioned film deposition conditions. FIG. 10 illustrates changes over time in the surfaces of the TiN films after the TiN films are left in an atmospheric pressure environment for 24 hours.

According to the results illustrated in FIG. 10, similarly to the results illustrated in FIG. 9, the comparative example indicates that fluorine reacts with moisture in the atmosphere. As a result, the surface of the TiN film is deteriorated, causing the surface to be uneven and corroded. Conversely, in the present embodiment illustrated in FIG. 9, the surface of the TiN film is not deteriorated and no corrosion or unevenness appears. As is clear from the above-described experimental results, the thickness of the flowable organic film R is 4 nm or more.

[Ashing]

Figure 11:
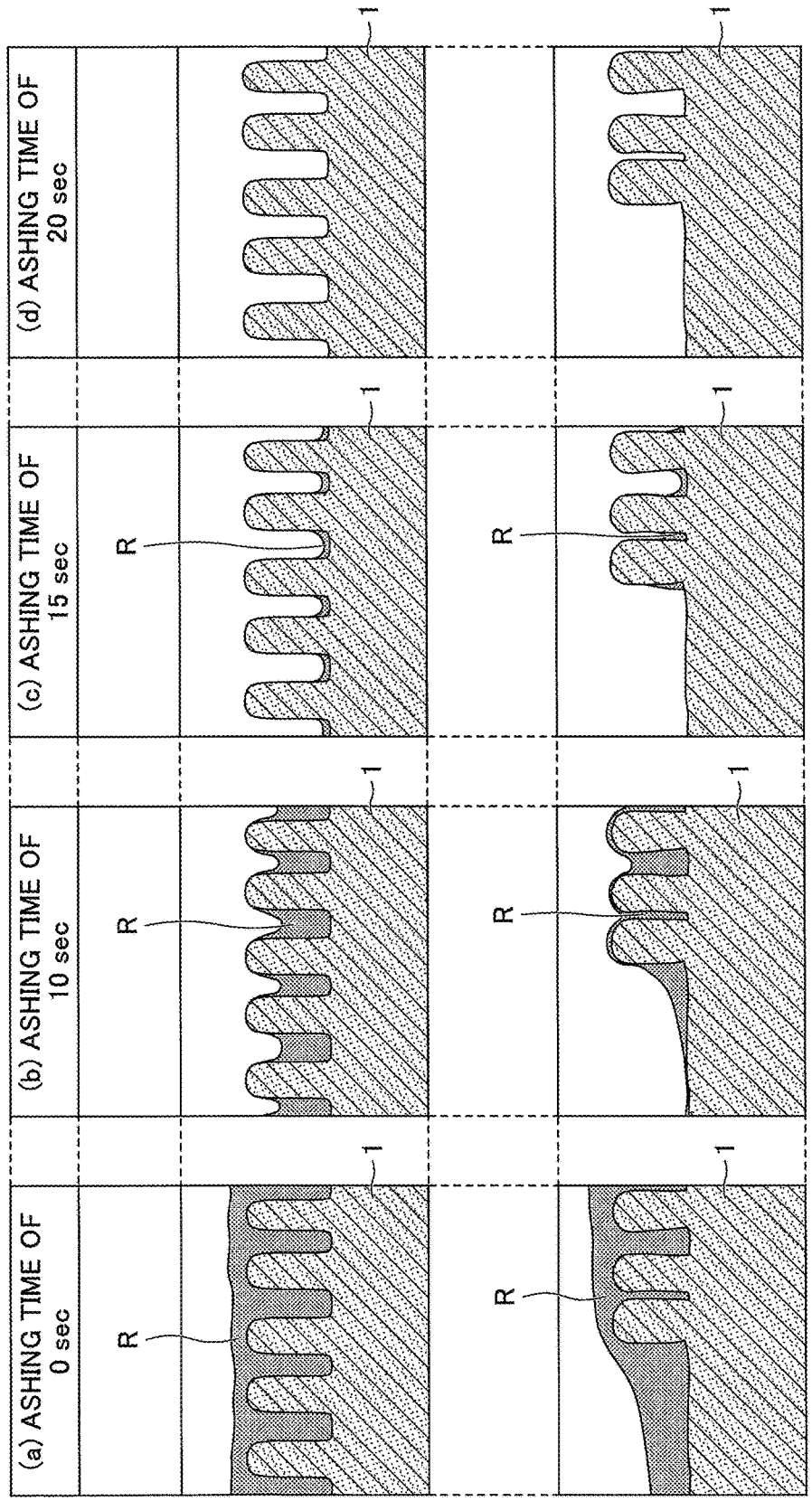
FIG. 11 is a drawing illustrating an example of results of ashing performed by an ashing method according to the embodiment.

Next, referring to FIG. 11, an example of a cleaning process of the wafer W performed in step ST5 of FIG. 2 will be described. In the present embodiment, results of ashing using oxygen plasma as the example of the cleaning process are illustrated in FIG. 11. Ashing conditions are as follows.

<Ashing Conditions>
Pressure in chamber: 100 mTorr
Type of gas/Gas flow rate: $O_2$, 900 sccm
Stage temperature: 80° C.
High frequency power HF (60 MHz): 500 W
High frequency power LF (400 kHz): 100 W FIG. 11 illustrates states of a flowable organic film R deposited in a SiN film 1 in cases of (a) an ashing time of 0 second, (b) an ashing time of 10 seconds, (c) an ashing time of 15 seconds, and (d) an ashing time of 20 seconds. As seen from FIG. 11, the flowable organic film R is completely removed by using $O_2$ plasma upon elapsing the ashing time of 20 seconds.

Accordingly, the flowable organic film R can be removed by using $O_2$ plasma. However, the present invention is not limited to plasma cleaning using $O_2$ plasma. The flowable organic film R may be removed by wet cleaning.

[Processing System]

Figure 12:
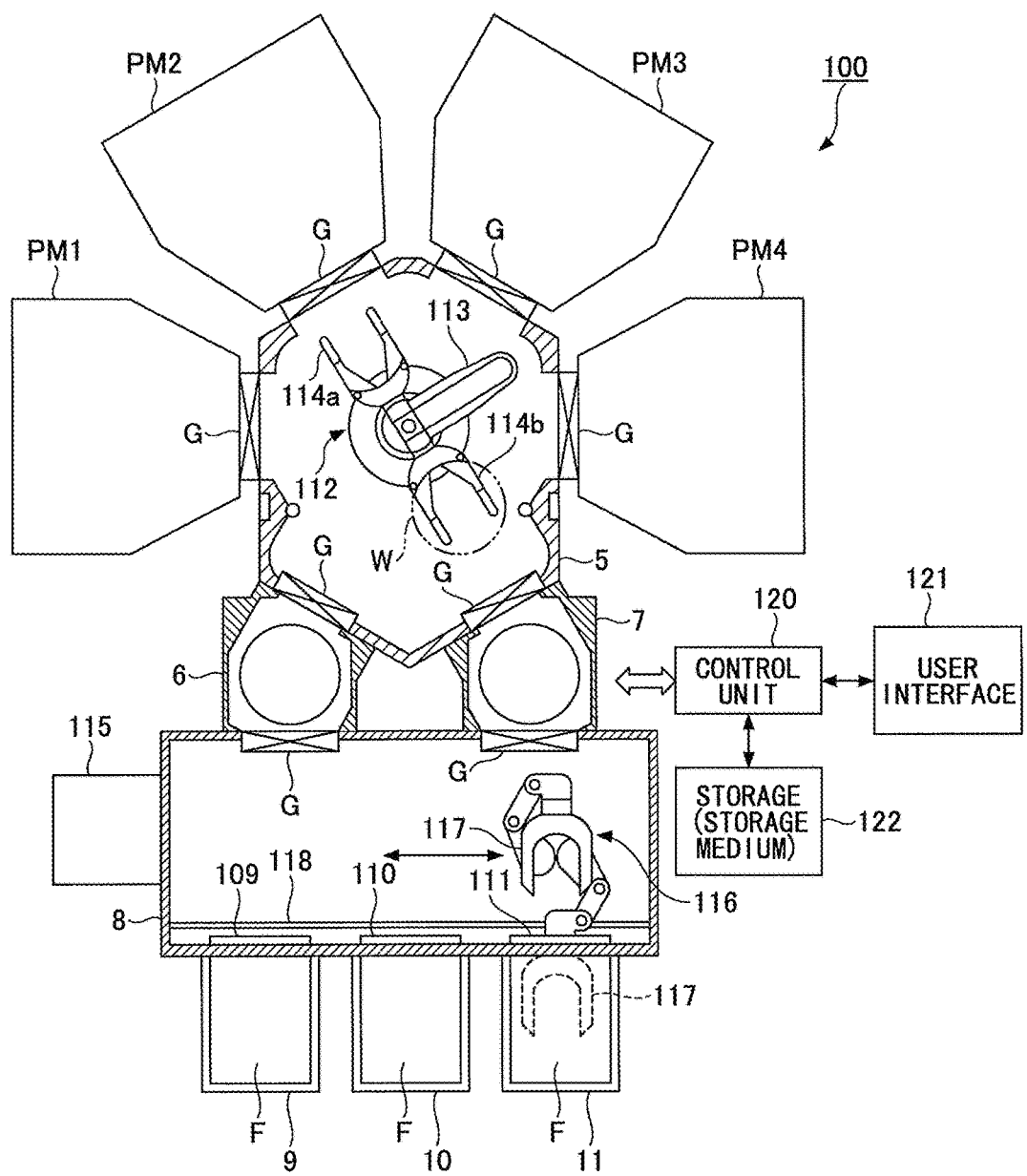
FIG. 12 is a drawing illustrating an example of a processing system according to the embodiment.

Next, referring to FIG. 12, an example of a processing system in which the etching process of steps ST1 and ST2 and the film deposition process of step ST3 of FIG. 2 will be described. FIG. 12 illustrates an example of a processing system 100 in which the etching process and the film deposition process can be performed in the in-system environment.

The processing system 100 includes an etching apparatus PM1 in which the etching process of steps ST1 and ST2 is performed and a film deposition apparatus PM2 in which the film deposition process of step ST3 is performed. In a processing apparatus PM3 and a processing apparatus PM4, the etching process or the film deposition process may be performed.

The etching apparatus PM1, the film deposition apparatus PM2, the processing apparatus PM3, and the processing apparatus PM4 are provided at four sides of a six-sided transfer chamber 5, respectively. Also, load-lock chambers 6 and 7 are provided at the remaining two sides of the transfer chamber 5, respectively. A loading/unloading chamber 8 is provided at the opposite side of the load-lock chambers 6 and 7 from the transfer chamber 5. Ports 9, 10, and 11 are provided at the opposite side of the loading/unloading chamber 8 from the load-lock chambers 6 and 7. Three FOUPs F where wafers W can be placed are attached to the ports 9, 10, and 11, respectively.

The etching apparatus PM1, the film deposition apparatus PM2, the processing apparatuses PM3 and PM4, and the load-lock chambers 6 and 7 are connected to the sides of the six-sided transfer chamber 5 through gate valves G, respectively. By opening the gate valves G, the apparatuses and the chambers communicate with the transfer chamber 5, and by closing the gate valves G, the apparatuses and the chambers are isolated from the transfer chamber 5. Further, the load-lock chambers 6 and 7 are also provided with gate valves G through which the loading/unloading chamber 8 are connected. By opening the gate valves G, the load-lock chambers 6 and 7 communicate with the loading/unloading chamber 8, and by closing the gate valves G, the load-lock chambers 6 and 7 are isolated from the loading/unloading chamber 8.

In the transfer chamber 5, a transfer device 112 for loading and unloading a wafer W into and from the etching apparatus PM1, the film deposition apparatus PM2, the processing apparatus PM3 and PM4, and the load-lock chambers 6 and 7 is provided. The transfer device 112 is disposed substantially at the center of the transfer chamber 5, and has two blades 114a and 114b for holding the wafer W. The blades 114a and 114b are provided at the distal end of a rotatable/extensible unit 113. The blades 114a and 114b are attached to the rotatable/extensible unit 113 in a manner such that blades 114a and 114b face opposite directions. The inside of the transfer chamber 5 is maintained at a predetermined degree of vacuum.

A HEPA filter (not illustrated) is provided at a ceiling of the loading/unloading chamber 8. Clean air free from organic substances and particles is supplied through the HEPA filter into the loading/unloading chamber 8 in a down-flow mode. Therefore, the wafer W is loaded and unloaded in the clear air at atmospheric pressure. Shutters (not illustrated) are respectively provided in the three ports 9, 10, and 11 to which the FOUPs are attached. The FOUPs in which wafers W are placed or that remain empty are directly attached to the ports 9, 10, and 11. When the FOUPs are attached to the ports 9, 10, and 11, the shutters are removed such that the FOUPs communicate with the loading/unloading chamber 8 while preventing outside air from entering. Further, an alignment chamber 115 is provided on one side of the loading/unloading chamber 8 to align the positions of the wafers W.

A transfer device 116 for loading and unloading the wafers W to and from the FOUPs and for loading and unloading the wafers W to and from the load-lock chambers 6 and 7 is provided inside the loading/unloading chamber 8. The transfer device 116 has two articulated arms and is configured to run on a rail 118 along the arrangement direction of the FOUPs F. In order to transfer the wafers W, the wafers W are placed on hands 117 installed at the distal end of the arms. FIG. 12 illustrates that one of the hands 117 is located in the loading/unloading chamber 8 and the other hand is inserted into one of the FOUPs F.

Components of the processing system 100 (for example, the etching apparatus PM1, the film deposition apparatus PM2, the processing apparatus PM3 and PM4, the load-lock chambers 6 and 7, and the transfer devices 112 and 116) are connected to and controlled by a control unit 120 including a computer. Further, a user interface 121 is connected to the control unit 120. The user interface 121 includes a keyboard with which an operator perform input operations such as inputting a command in order to manage the system, and also includes a display for visually displaying the operating state of the system.

Further, storage 122 is connected to the control unit 120. The storage 122 stores control programs for causing the system to execute various processes illustrated in FIG. 2 as controlled by the control unit 120 and stores programs (namely processing recipes) for causing the respective components to execute processes in accordance with processing conditions. The processing recipes are stored in a storage medium of the storage 122. The storage medium may be a hard disk or may be a portable medium such as a CD-ROM, a DVD, and flash memory. Further, the processing recipes may be appropriately transmitted from other devices through, for example, a dedicated line.

In the processing system 100, for example, a process is performed by calling a processing recipe from the storage 122 in response to an instruction from the user interface 121 and causing the control unit 120 to execute the processing recipe. The control unit 120 may directly control the respective components. Alternatively, the respective components may be provided with individual controllers such that the control unit 120 can control the respective components through the controllers.

In the processing system 100 according to an embodiment, the FOUP F is loaded first. Next, a wafer W is taken out of the FOUP F and loaded into the alignment chamber 115 where the position of the wafer W is aligned. Subsequently, the wafer W is loaded into one of the load-lock chambers 6 and 7, and the inside of the load-lock chamber is vacuumed. The wafer W is taken out of the load-lock chamber and loaded into the etching apparatus PM1 by the transfer device 112 in the transfer chamber 5. Then, the etching process of steps ST1 and ST2 is performed.

The wafer W that has been etched is unloaded from the etching apparatus PM1 and loaded into the film deposition apparatus PM2. In the film deposition apparatus PM2, at least 4 nm of a flowable organic film 106 is deposited on the Cu wiring 102 and the TiN film 105 of the wafer W by using the film deposition method of the present embodiment. Subsequently, the wafer W is taken out of the film deposition apparatus PM2 by the transfer device 112 and the wafer W is loaded into one of the load-lock chambers 6 and 7 by the transfer device 112. The pressure in the load-lock chamber is restored to the atmospheric pressure. The wafer W is taken out of the load-lock chamber by the transfer device 116 and is placed into one of the FOUPs F. The FOUP F is transferred for the next process.

As described above, in the in-system environment, the wafer is transferred via the following route: (a) FOUP F→(b) loading/unloading chamber 8→(c) load-lock chamber 6 or 7→(d) transfer chamber 5→(e) etching apparatus PM1 (etching)→(f) transfer chamber 5→(g) film deposition apparatus PM2 (flowable organic film)→(h) transfer chamber 5→(i) load-lock chamber 6 or 7→(j) loading/unloading chamber 8→(k) FOUP F→next process.

Via the above-described route, the wafer W is transferred in an atmospheric pressure environment and is exposed to the atmosphere from (a) to (c) and from (i) to (k). However, in the present embodiment, the Cu wiring 102 exposed by the etching process performed in the (e) etching apparatus PM1 and the TiN film 105 as a mask are coated with a flowable organic film by the film deposition process performed in the (g) film deposition apparatus PM2. Also, the wafer W is transferred under vacuum and is not exposed to the atmosphere from (e) the etching apparatus PM1 through (f) the transfer chamber 5 to (g) the film deposition apparatus.

Accordingly, although the wafer W is transferred in an atmospheric pressure environment and is exposed to the atmosphere from (i) to (k), it is possible to prevent the Cu wiring 102 and the TiN film 105 from reacting with moisture in the atmosphere because the flowable organic film serves as a protective film. As a result, the Cu wiring 102 and the TiN film 105 of the wafer W can be prevented from being corroded.

Further, in the present embodiment, in the in-situ environment, the flowable organic film may be deposited in the same chamber as a chamber in which the etching process of steps ST1 and ST2 are performed. For example, the etching process and the film deposition process may be performed successively in the processing apparatus PM3 of the processing system 100 of FIG. 12.

In this case, the wafer W is transferred via the following route:
(a) FOUP F→(b) Loading/unloading chamber 8→(c) load-lock chamber (6 or 7)→(d) transfer chamber 5→(e) processing apparatus PM3 (etching +film deposition (flowable organic film))→(h) transfer chamber 5→(i) load-lock chamber (6 or 7)→(j) loading/unloading chamber 8→(k) FOUP F→next process.

Via this route, although the wafer W is transferred in an atmospheric pressure environment and is exposed to the atmosphere from (i) to (k), it is possible to prevent the Cu wiring 102 and the TiN film 105 from reacting with moisture in the atmosphere because the flowable organic film serves as a protective film. As a result, the Cu wiring 102 and the TiN film 105 of the wafer W can be prevented from being corroded.

The processing system 100 of the present embodiment includes the etching apparatus and the film deposition apparatus for a flowable organic film (in the in-system environment), or includes the plasma processing apparatus in which both etching and deposition of a flowable organic film can be performed (in the in-situ environment). This allows precursors in plasma generated from a gas containing a low vapor pressure material such as a carbon-containing gas to be deposited from the bottoms of recessed portions formed in the wafer W. Accordingly, the Q-time can be managed by depositing a flowable organic film over the wafer W and coating a metal film with the flowable organic film.

[Example of Configuration of Plasma Processing Apparatus]

Figure 13:
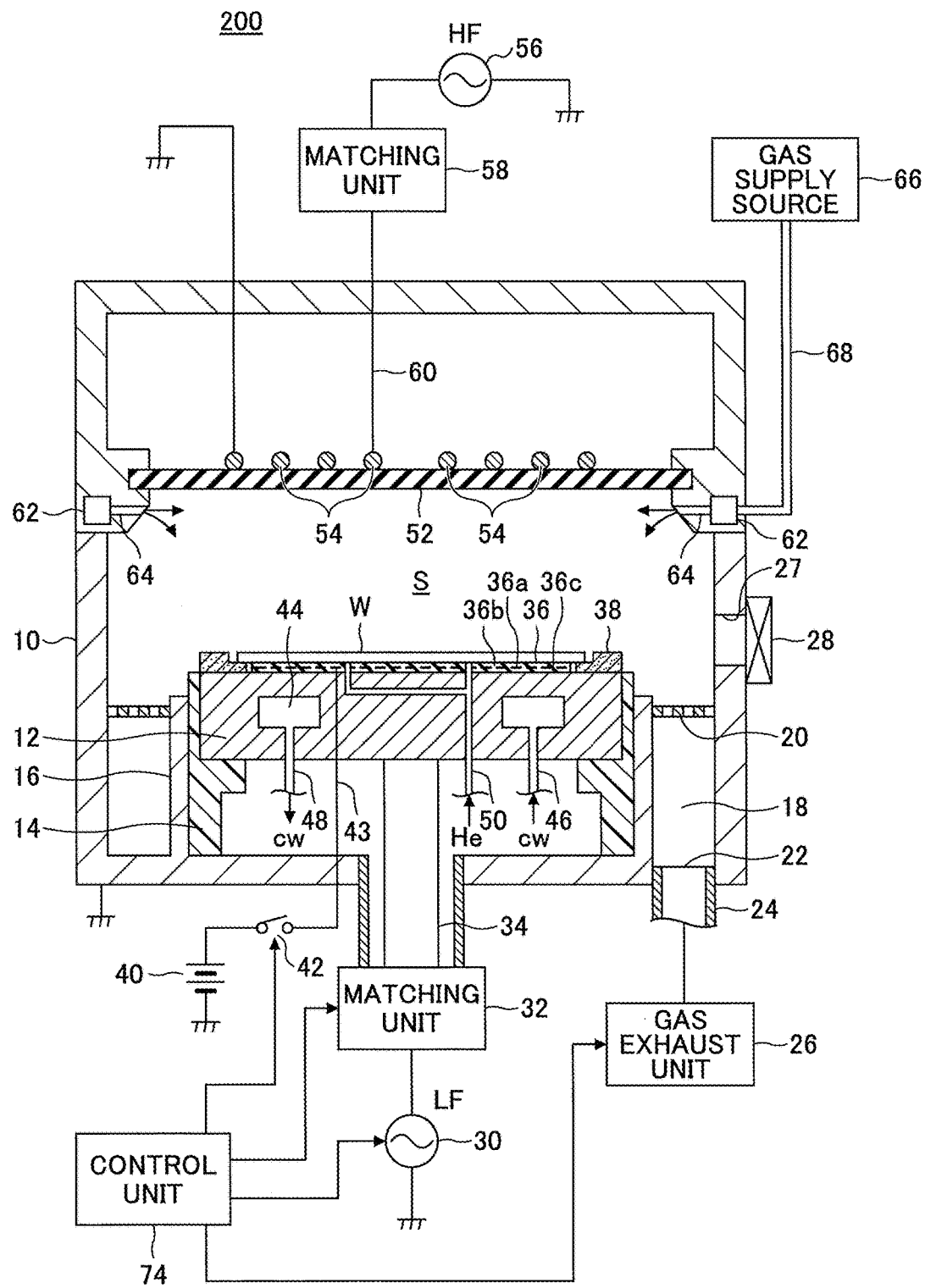
FIG. 13 is a drawing illustrating an example of a plasma processing apparatus according to the embodiment.

Next, referring to FIG. 13, an example of a configuration of a plasma processing apparatus disposed in the processing system of the present embodiment will be described. FIG. 13 illustrates an example of a configuration of a plasma processing apparatus of the present embodiment. The plasma processing apparatus functions as an etching apparatus for performing the etching process of step ST1 and step ST2 in FIG. 2 and functions as a film deposition apparatus for performing the film deposition process of step ST3 in FIG. 2.

In the present embodiment, as an example of the plasma processing apparatus, an inductively coupled plasma (ICP) processing apparatus will be described.

An inductively coupled plasma processing apparatus 200 is configured as a plasma processing apparatus that uses planar coil-shaped radio-frequency (RF) antennas. For example, the inductively coupled plasma processing apparatus 200 includes a cylindrical vacuum chamber 10 made of metal such as aluminum or stainless steel. The chamber 10 is securely grounded.

In the lower center of the chamber 10, a circular-shaped stage 12 is disposed horizontally as a substrate-holding table that also serves as a high frequency electrode. A semiconductor wafer (hereinafter referred to as a "wafer W") as an example of a substrate to be processed is placed on the stage 12. The stage 12 is made of aluminum, for example. The stage 12 is supported by a cylindrical insulating support 14 extending vertically upward from the bottom of the chamber 10.

Along the outer periphery of the cylindrical insulating support 14, an annular exhaust passage 18 is formed between a cylindrical conductive support 16 extending vertically upward from the bottom of the chamber 10 and an inner wall of the chamber 10. An annular baffle plate 20 is installed at an inlet or in a midsection of the exhaust passage 18, and also an exhaust port 22 is disposed at the bottom of the exhaust passage 18. In order to make uniform a flow of gas in the chamber 10 axisymmetrically with respect to the wafer W on the stage 12, the plurality of exhaust ports 22 are preferably provided at equal intervals in the circumferential direction.

An exhaust unit 26 is coupled to each of the exhaust ports 22 through an exhaust pipe 24. The exhaust unit 26 includes a vacuum pump such as a turbo molecular pump and can reduce a pressure in a plasma processing space of the chamber 10 to a predetermined degree of vacuum. Further, a gate valve 28 configured to open and close a loading/unloading port 27 for the wafer W is installed on the outer sidewall of the chamber 10.

A second high frequency power supply 30 is electrically connected to the stage 12 through a matching unit 32 and a power feeding rod 34. The second high frequency power supply 30 outputs, at a desired power level, high frequency power LF for bias application having a certain frequency (for example, 400 kHz) suitable for controlling energy of ions attracted to the wafer W. The matching unit 32 has a variable reactance matching circuit configured to match impedance on the second high frequency power supply 30 side and impedance on a load (mainly, stage, plasma, and chamber) side. The matching circuit includes a blocking capacitor for self-bias generation.

An electrostatic chuck 36 is provided on the upper surface of the stage 12. The electrostatic chuck 36 holds the wafer W by an electrostatic attractive force. On the outer periphery side of the electrostatic chuck 36, a focus ring 38 surrounding the periphery of the wafer W is provided. The electrostatic chuck 36 includes an electrode 36a formed of a conductive film that is sandwiched between a pair of insulating films 36b and 36c. A high voltage direct current power supply 40 is electrically connected to the electrode 36a via a switch 42 and a covered wire 43. Using a direct current supplied from the direct current power supply 40, the wafer W can be attracted and held on the electrostatic chuck 36 by an electrostatic force.

In the stage 12, an annular coolant or a coolant path 44 extending, for example, in a circumferential direction is provided. A coolant, for example, cooling water cw at a predetermined temperature is supplied from a chiller unit through pipes 46 and 48 into the coolant path 44 for circulation. A processing temperature of the wafer W on the electrostatic chuck 36 is controlled by the temperature of the coolant. In relation to this, a heat-transfer gas such as He gas from a heat transfer gas supply unit is supplied between the upper surface of the electrostatic chuck 36 and the bottom surface of the wafer W through a gas supply pipe 50. Also, in order to load and unload the wafer W, an elevating mechanism including a lift pin vertically extending through the stage 12 and capable of being moved up and down is provided.

Next, configurations of respective components involved in generating plasma in the inductively coupled plasma processing apparatus 200 will be described. At a ceiling of the chamber 10, a circular dielectric window 52 formed of, for example, a quartz plate is airtightly provided so as to be spaced apart from the stage 12 at a relatively large distance. On the dielectric window 52, coil-shaped RF antennas 54 are arranged horizontally and coaxially with the chamber 10 or the stage 12. Preferably, the RF antennas 54 take a form of, for example, a spiral coil, or a concentric coil with the radius of each circle being constant. The RF antennas 54 are fixed to the top surface of the dielectric window 52 by an antenna fixing member formed of an insulator.

One end of the RF antenna 54 is electrically connected to an output terminal of a first high frequency power supply 56 via a matching unit 58 and a power supply line 60. The other end of the RF antenna 54 is electrically connected to a ground potential via a ground line.

The first high frequency power supply 56 outputs, at a desired power level, high frequency power HF having a frequency (for example, 27 MHz or more (such as 60 MHz) suitable for plasma generation by high frequency discharge. The matching unit 58 has a variable reactance matching circuit configured to match impedance on the first high frequency power supply 56 side and impedance on a load (mainly, RF antenna, plasma, and correction coil) side. A gas supply unit for supplying a predetermined gas into a processing space in the chamber 10 includes an annular manifold or a buffer unit 62 located inside (or outside) the sidewall of the chamber 10 at a position slightly lower than the dielectric window 52, a plurality of sidewall gas injection holes 64 circumferentially formed on the sidewall at equal intervals and opened to a plasma generating space from the buffer unit 62, and a gas supply pipe 68 extending from a gas supply source 66 to the buffer unit 62. The gas supply source 66 includes a flow rate controller and an on-off valve.

A control unit 74 includes a microcomputer, for example. The control unit 74 controls the individual operations of respective components in the plasma processing apparatus 200 such as the exhaust unit 26, the second high frequency power supply 30, the first high frequency power supply 56, the matching unit 32, the matching unit 58, the switch 42 for the electrostatic chuck, the gas supply source 66, the chiller unit, and the heat-transfer gas supply unit of the plasma processing apparatus 200, and also controls the overall operation of the plasma processing apparatus 200.

In the inductively coupled plasma processing apparatus 200, in order to perform a film deposition process, the gate valve 28 is first opened. Subsequently, a wafer W as an object to be processed is loaded into the processing chamber 10 and placed on the electrostatic chuck 36. Then, the gate valve 28 is closed. A predetermined gas is introduced from the gas supply source 66 through the gas supply pipe 68, the buffer unit 62, and the sidewall gas injection holes 64 into the chamber 10 at a predetermined flow rate and a predetermined flow rate ratio. A pressure in the chamber 10 is set to a predetermined value by the exhaust unit 26.

Further, the first high frequency power supply 56 is turned on and outputs, at a predetermined RF power level, high frequency power HF for plasma generation. Accordingly, the high frequency power HF is supplied to the RF antennas 54 through the matching unit 58 and the power supply line 60.

Further, in order to supply high frequency power LF for ion attraction control, the second high frequency power supply 30 is turned on and outputs the high frequency power LF, such that the high frequency power LF is supplied to the stage 12 through the matching unit 32 and the power feeding rod 34. In conditions under which no high frequency power LF for ion attraction control is supplied, the high frequency power is set to 0 W. Further, the heat-transfer gas supply unit supplies a heat-transfer gas to a contact surface between the electrostatic chuck 36 and the wafer W, and the switch 42 is turned on. Accordingly, the heat-transfer gas is confined in the contact surface by an electrostatic attractive force of the electrostatic chuck 36.

The predetermined gas injected from the sidewall gas injection holes 64 is uniformly diffused in the processing space below the dielectric window 52. At this time, as high frequency current HF flows through the RF antennas 54, a RF magnetic field is generated around the RF antennas 54 where magnetic lines of force travel through the dielectric window 52 and the plasma generating space S in the chamber. Changes over time in the generated RF magnetic field cause the RF magnetic field to be induced azimuthally. Moreover, electrons azimuthally accelerated by the induced electric field collide with and ionize molecules and atoms of the gas supplied. Thereby, doughnut-shaped plasma is generated. In the wide processing space, radicals and ions of the doughnut-shaped plasma are diffused in all directions. The radicals and the ions are supplied to the upper surface (surface to be processed) of the wafer W, with the radicals being made to strike isotoropically and the ions being attracted by a DC bias. Accordingly, active species in the plasma cause chemical reactions and physical reaction on the surface of the wafer W. Thereby, a film to be processed is etched into a desired pattern.

As described above, the inductively coupled plasma processing apparatus 200 generates doughnut-shaped inductively coupled plasma below the dielectric window 52 in proximity to the RF antennas and diffuses the doughnut-shaped plasma in the wide processing space, such that the density of the plasma in the vicinity of the stage 12 (namely, above the wafer W) is equalized. Herein, the density of the doughnut-shaped plasma depends on the intensity of the induced electric field, and further depends on the amount of high frequency power HF supplied to the RF antennas 54 (more accurately, the amount of a current flowing through the RF antennas 54). Namely, as the high frequency power HF increases, the density of the doughnut-shaped plasma becomes high, and also the overall density of the plasma in the vicinity of the stage 12 during the diffusion of the plasma becomes high. The diffusion of the doughnut-shaped plasma in all directions (especially, in the radical direction) mainly depends on the pressure inside the chamber 10. As the pressure decreases, the plasma becomes more concentrated in a central part of the chamber 10, and the density distribution of the plasma in the vicinity of the stage 12 tends to be raised in the center. Further, the density distribution of the doughnut-shaped plasma may be changed depending on the high frequency power HF supplied to the RF antennas 54 and the flow rate of the processing gas introduced into the chamber 10.

Herein, the term "doughnut-shaped plasma" is not strictly limited to ring-shaped plasma that is generated at the radially outer portion of the chamber 10 without being generated at the radially inner portion (central portion) of the chamber 10. Rather, the term "doughnut-shaped plasma" means that the volume or the density of the plasma generated at the radially outer portion of the chamber 10 is larger than that at the radially inner portion. Also, the plasma may be formed in another shape instead of the doughnut shape, depending on the conditions such as the type of the processing gas used and the pressure inside the chamber 10.

Although not illustrated, the control unit 74 includes CPU, read-only memory (ROM), and random-access memory (RAM). The control unit 74 controls the respective components of the inductively coupled plasma processing apparatus 200 of the present embodiment in accordance with procedures set in recipes stored, for example, in the RAM. Accordingly, the control unit 74 controls the semiconductor manufacturing method according to the present embodiment.

The inductively coupled plasma processing apparatus 200 having the above-described configuration can perform at least one of the etching process and the film deposition process.

The plasma processing apparatus performing the semiconductor manufacturing method according to the present embodiment is not limited to an inductively coupled plasma processing apparatus (ICP apparatus) and a capacitively coupled plasma processing apparatus (a CCP apparatus using two frequencies at an upper and a lower portions) that supplies high frequency power for plasma generation to an upper electrode. Such a plasma processing apparatus may be either a microwave plasma processing apparatus or a remote plasma apparatus.

As described above, according to the semiconductor manufacturing method of the present embodiment, metal included in a conductive layer formed on an object to be processed can be prevented from being corroded in semiconductor manufacturing.

According to an aspect of at least one embodiment, a conductive layer formed on an object to be processed can be prevented from being corroded in semiconductor manufacturing.

Although embodiments of the semiconductor manufacturing method and the plasma processing apparatus have been described above, the present invention is not limited to these embodiments. Various variations and modifications may be made without departing from the scope of the present invention. It should be noted that the above-described embodiments may be combined as long as no contradiction occurs.

For example, although the wafer W has been described as an example of an object to be processed, the present invention is not limited thereto. Various substrates used for a liquid crystal display (LCD) and a flat panel display (FPD), a photomask, a CD substrate, a printed circuit board, and the like may be used.

Further, in the above-described embodiments, although a case in which metal such as Cu is used as a conductive layer of the wafer W has been described, the present invention is not limited thereto. For example, the conductive layer may be a silicon-containing conductive film, such as conductive film containing ruthenium (Ru) silicide, nickel (Ni) silicide, cobalt (Co) silicide, silicide containing carbon (C), lightly boron (B)-doped silicon, lightly arsenic (As)-doped silicon, polycrystalline silicon, amorphous silicon, and silicon-germanium (SiGe).

What is claimed is:

1. A plasma processing apparatus comprising:
   a stage on which an object to be processed is placed;
   a gas supply unit configured to supply a gas; and
   a control unit,
   wherein the control unit is configured to perform control for
   etching an insulating film over a conductive layer of an object to be processed into a pattern of a mask, and exposing the conductive layer to a recessed portion formed in the insulating film; and
   forming an organic film in the recessed portion of the insulating film to which the conductive layer is exposed,
   in the forming of the organic film,
   maintaining an inside of a chamber at a predetermined pressure, cooling a stage to a temperature of −20° C. or less, and placing the object to be processed on the stage,
   supplying a gas including a gas containing a low vapor pressure material to the inside of the chamber, and
   generating plasma from the gas including the gas containing the low vapor pressure material, and causing precursors generated from the low vapor pressure material and included in the plasma to be deposited on the conductive layer such that the organic film is formed.

2. A semiconductor manufacturing method comprising:

a first process of etching an insulating film over a conductive layer of an object to be processed into a pattern of a mask, and exposing the conductive layer to a recessed portion formed in the insulating film; and a second process of forming an organic film in the recessed portion of the insulating film to which the conductive layer is exposed, the second process including, maintaining an inside of a chamber at a predetermined pressure, cooling a stage to a temperature of −20° C. or less, and placing the object to be processed on the stage, supplying a gas including a gas containing a low vapor pressure material to the inside of the chamber, and generating plasma from the gas including the gas containing the low vapor pressure material, and causing precursors generated from the low vapor pressure material and included in the plasma to be deposited on the conductive layer such that the organic film is formed.

3. The semiconductor manufacturing method according to claim 2, wherein the second process of forming the organic film causes the precursors to be deposited in the recessed portion of the insulating portion from a bottom of the recessed portion of the insulating film in a bottom-up approach.

4. The semiconductor manufacturing method according to claim 2, wherein the organic film formed in the second process is flowable and has a thickness of at least 4 nm.

5. The semiconductor manufacturing method according to claim 2, wherein the precursors are caused to be deposited on an entire surface of the conductive layer such that the organic film is formed.

6. The semiconductor manufacturing method according to claim 2, wherein the object to be processed is transferred to a cleaning apparatus in an atmospheric pressure environment after the second process is performed, and the cleaning apparatus removes the organic film.

7. The semiconductor manufacturing method according to claim 6, wherein the gas containing the low vapor pressure material is made of a material that is removable by the cleaning apparatus.

8. The semiconductor manufacturing method according to claim 7, wherein the gas containing the low vapor pressure material is a carbon-containing gas.

9. The semiconductor manufacturing method according to claim 8, wherein the gas containing the low vapor pressure material is formed of $C_4F_8$, $C_4F_6$, or isopropyl alcohol (IPA).

* * * * *